(12) United States Patent
Labram

(10) Patent No.: US 12,369,446 B2
(45) Date of Patent: Jul. 22, 2025

(54) RETINOMORPHIC SENSOR

(71) Applicant: Oregon State University, Corvallis, OR (US)

(72) Inventor: John G Labram, London (GB)

(73) Assignee: OREGON STATE UNIVERSITY, Corvallis, OR (US)

( * ) Notice: Subject to any disclaimer, the term of this patent is extended or adjusted under 35 U.S.C. 154(b) by 517 days.

(21) Appl. No.: 17/975,667

(22) Filed: Oct. 28, 2022

(65) Prior Publication Data

US 2023/0132824 A1   May 4, 2023

Related U.S. Application Data

(60) Provisional application No. 63/263,545, filed on Nov. 4, 2021.

(51) Int. Cl.
*H10K 10/10* (2023.01)
*H10K 30/30* (2023.01)
*H10K 39/32* (2023.01)

(52) U.S. Cl.
CPC ............. *H10K 10/10* (2023.02); *H10K 39/32* (2023.02); *H10K 30/30* (2023.02)

(58) Field of Classification Search
CPC .................. H10K 10/00–10; H10K 39/00–89
See application file for complete search history.

(56) References Cited

U.S. PATENT DOCUMENTS

| 8,519,382 | B2 | 8/2013 | Boulais |
| 2010/0135591 | A1 | 6/2010 | Zador |
| 2016/0093273 | A1 | 3/2016 | Wang |

OTHER PUBLICATIONS

Y.-L. Wu, K. Fukuda, T. Yokota, T. Someya, Adv. Mater. 2019, 31, 1903687. (Year: 2019).*
D. I. Barnea, H. F. Silverman, IEEE Trans. Comput. 1972, C-21, 179.
B. D. Lucas, T. Kanade, in Proc. 7th Int. Jt. Conf. Artif. Intell.—vol. 2, Morgan Kaufmann Publishers Inc., San Francisco, CA, USA, 1981, pp. 674-679.
C. Posch, T. Serrano-Gotarredona, B. Linares-Barranco, T. Delbruck, Proc. IEEE 2014, 102, 1470.
Y. Guo, Y. Liu, A. Oerlemans, S. Lao, S. Wu, M. S. Lew, Neurocomputing 2016, 187, 27.
G. Yu, G. Srdanov, J. Wang, H. Wang, Y. Cao, A. J. Heeger, Synth. Met. 2000, 111-112, 133.
E. D. Adrian, R. Matthews, J. Physiol. 1927, 63, 378.
H. K. Hartline, C. H. Graham, J. Cell. Comp. Physiol. 1932, 1, 277.
C. Trujillo Herrera, J. G. Labram, Appl. Phys. Lett. 2020, 117, 233501.
H. J. Snaith, Nat. Mater. 2018, 17, 372.

(Continued)

*Primary Examiner* — Daniel P Shook
(74) *Attorney, Agent, or Firm* — Niels Haun; Dann, Dorfman, Herrell & Skillman, P.C.

(57) ABSTRACT

A retinomorphic sensor is demonstrated employing organic semiconductors. The sensor produces an output voltage in response to changes in illumination, but zero output voltage under constant illumination. The device is stable for periods up to one hour, exhibits a decay constant tunable through choice of external resistor, with fastest response times below 10 µs.

15 Claims, 39 Drawing Sheets

(56) References Cited

OTHER PUBLICATIONS

H. J. Snaith, A. Abate, J. M. Ball, G. E. Eperon, T. Leijtens, N. K. Noel, S. D. Stranks, J. T.-W. Wang, K. Wojciechowski, W. Zhang, J. Phys. Chem. Lett. 2014, 5, 1511.
J. M. Frost, A. Walsh, Acc. Chem. Res. 2016, 49, 528.
Y.-H. Lin, P. Pattanasattayavong, T. D. Anthopoulos, Adv. Mater. 2017, 29, 1702838.
J. G. Labram, D. H. Fabini, E. E. Perry, A. J. Lehner, H. Wang, A. M. Glaudell, G. Wu, H. Evans, D. Buck, R. Cotta, L. Echegoyen, F. Wudl, R. Seshadri, M. L. Chabinyc, J. Phys. Chem. Lett. 2015, 6, 3565.
H. Kim, C. M. Gilmore, A. Piqué, J. S. Horwitz, H. Mattoussi, H. Murata, Z. H. Kafafi, D. B. Chrisey, J. Appl. Phys. 1999, 86, 6451.
W. Cao, J. Li, H. Chen, J. Xue, J. Photonics Energy 2014, 4, 040990.
H. Shirakawa, E. J. Louis, A. G. MacDiarmid, C. K. Chiang, A. J. Heeger, J. Chem. Soc. Chem. Commun. 1977, 0, 578.
S. Holliday, R. S. Ashraf, A. Wadsworth, D. Baran, S. A. Yousaf, C. B. Nielsen, C.-H. Tan, S. D. Dimitrov, Z. Shang, N. Gasparini, M. Alamoudi, F. Laquai, C. J. Brabec, A. Salleo, J. R. Durrant, I. McCulloch, Nat. Commun. 2016, 7, 11585.
A. F. Paterson, S. Singh, K. J. Fallon, T. Hodsden, Y. Han, B. C. Schroeder, H. Bronstein, M. Heeney, I. McCulloch, T. D. Anthopoulos, Adv. Mater. 2018, 30, 1801079.
L. M. Herz, ACS Energy Lett. 2017, 1539.
A. Miyata, A. Mitioglu, P. Plochocka, O. Portugall, J. T.-W. Wang, S. D. Stranks, H. J. Snaith, R. J. Nicholas, Nat. Phys. 2015, 11, 582.
M. Knupfer, Appl. Phys. A 2003, 77, 623.
L. Benatto, K. R. de A. Sousa, M. Koehler, J. Phys. Chem. C 2020, 124, 13580.
S. M. Sze, K. K. Ng, Physics of Semiconductor Devices, John Wiley & Sons, 2006.
M. S. Vezie, S. Few, I. Meager, G. Pieridou, B. Dörling, R. S. Ashraf, A. R. Goñi, H. Bronstein, I. McCulloch, S. C. Hayes, M. Campoy-Quiles, J. Nelson, Nat. Mater. 2016, advance online publication, DOI 10.1038/nmat4645.
J. Nelson, Mater. Today 2011, 14, 462.
F. Gao, L. J. A. Koster, T.-Q. Nguyen, N. Stingelin, Adv. Energy Mater. 2018, 8, 1802706.
C. Trujillo Herrera, M. J. Hong, J. G. Labram, ACS Appl. Electron. Mater. 2020, 2, 2257.
M. Jørgensen, K. Norrman, S. A. Gevorgyan, T. Tromholt, B. Andreasen, F. C. Krebs, Adv. Mater. 2012, 24, 580.
D. M. de Leeuw, M. M. J. Simenon, A. R. Brown, R. E. F. Einerhand, Synth. Met. 1997, 87, 53.
J. Ahmad, K. Bazaka, L. J. Anderson, R. D. White, M. V. Jacob, Renew. Sustain. Energy Rev. 2013, 27, 104.
C. G. Shuttle, B. O'Regan, A. M. Ballantyne, J. Nelson, D. D. C. Bradley, J. R. Durrant, Phys. Rev. B 2008, 78, 113201.
G. Lakhwani, A. Rao, R. H. Friend, Annu. Rev. Phys. Chem. 2014, 65, 557.
G. Juška, K. Genevičius, N. Nekrašas, G. Sliažys, G. Dennler, Appl. Phys. Lett. 2008, 93, 143303.
C. Liu, Y. Xu, Y.-Y. Noh, Mater. Today 2015, 18, 79.
I. Levine, S. Gupta, T. M. Brenner, D. Azulay, O. Millo, G. Hodes, D. Cahen, I. Balberg, J. Phys. Chem. Lett. 2016, 7, 5219.
J. G. Labram, E. E. Perry, N. R. Venkatesan, M. L. Chabinyc, Appl. Phys. Lett. 2018, 113, 153902.
I. Balberg, J. Appl. Phys. 1994, 75, 914.
L.-L. Chua, J. Zaumseil, J.-F. Chang, E. C.-W. Ou, P. K.-H. Ho, H. Sirringhaus, R. H. Friend, Nature 2005, 434, 194.
T. D. Anthopoulos, B. Singh, N. Marjanovic, N. S. Sariciftci, A. Montaigne Ramil, H. Sitter, M. Cölle, D. M. de Leeuw, Appl. Phys. Lett. 2006, 89, 213504.
O. Ostroverkhova, Chem. Rev. 2016, 116, 13279.
P. B. Miranda, D. Moses, A. J. Heeger, Phys. Rev. B 2001, 64, 081201.
I.-W. Hwang, D. Moses, A. J. Heeger, J. Phys. Chem. C 2008, 112, 4350.
A. Pivrikas, H. Neugebauer, N. S. Sariciftci, IEEE J. Sel. Top. Quantum Electron. 2010, 16, 1746.
C. J. Brabec, M. Heeney, I. McCulloch, J. Nelson, Chem. Soc. Rev. 2011, 40, 1185.
M. J. Ford, J. G. Labram, M. Wang, H. Wang, T.-Q. Nguyen, G. C. Bazan, Adv. Electron. Mater. 2017, 3, 1600537.
C. Trujillo Herrera, J. G. Labram, ACS Appl. Electron. Mater. 2022, 4, 92-98.

\* cited by examiner

RETINOMORPHIC SENSOR

RELATED APPLICATIONS

This application claims the benefit of priority of U.S. Provisional Application No. 63/263,545, filed on Nov. 4, 2021, the entire contents of which application(s) are incorporated herein by reference.

GOVERNMENT LICENSE RIGHTS

This invention was made with government support under Award No. 1942558 awarded by the National Science Foundation. The government has certain rights in the invention.

FIELD OF THE INVENTION

The present invention relates generally to retinomorphic sensors, and more particularly, but not exclusively, to retinomorphic sensors that include organic semiconductors as an absorber layer.

BACKGROUND OF THE INVENTION

Inspired by the way retinal cells respond to light, retinomorphic sensors are hoped to enable faster identification of moving objects than software-based approaches. Unlike conventional optical sensors, such as photodiodes, retinomorphic sensors are designed to produce an output signal in response to changes in illumination, but not under constant illumination.

While automated analysis of images has been intensely studied for decades, its use is becoming more frequently demanded in commercial products. Currently, the analysis of visual information occurs almost exclusively in processors, with data provided as a series of conventional images, such as bitmaps. Because of restrictions due to frame rate and processing time, the speed at which moving objects can be identified using conventional cameras is fundamentally limited.

Most cameras employ a 2D array of complementary metal oxide semiconductor (CMOS) or charged coupled device (CCD) sensors, both utilizing photodiodes to detect light. A photodiode will output a signal (current) that depends on the intensity of light that falls upon it. Unlike photodiodes, animal retinas produce a stronger signal in response to time-varying visual stimuli than to static images. This strategy results in a large volume of non-pertinent information being filtered out by the detector/eye, before it reaches the processor/brain. Accordingly, we believe that important advances in detector technology may be achieved through novel retinomorphic sensors.

SUMMARY OF THE INVENTION

In one of its aspects the present invention represents a first demonstration of a retinomorphic sensor employing organic semiconductors as the absorber layer. This retinomorphic sensor can exhibit stability under constant measurement conditions up to a period of 1 hour, compared to a few 10's of seconds for previously reported devices based on metal halide perovskites (MHPs). Exemplary retinomorphic sensors in accordance with the present invention can also exhibit characteristic decay times which are tunable through a choice of external resistor, demonstrated down to 10 μs, roughly 10,000 times faster than equivalent MHP devices. Such organic retinomorphic sensors were observed to produce a measurable response even without an input voltage, suggesting they can be implemented as 2 terminal devices, as opposed to 3 terminal devices, as previously thought.

Thus, in one of its aspects the present invention may provide a retinomorphic sensor, comprising an upper electrode and a lower electrode, and an organic semiconductor and dielectric layer disposed therebetween. The organic semiconductor may be in electrical communication with the upper electrode, and the dielectric layer may be disposed in electrical communication with the lower electrode. The organic semiconductor may be absorptive to visible light. The organic semiconductor may include poly(3-hexylthiophene-2,5-diyl), phenyl-C61-butyric acid methyl, or combinations thereof, such as a 50:50 (weight %) blend of phenyl-C61-butyric acid methyl and poly(3-hexylthiophene-2,5-diyl). The upper electrode may include a transparent conducting oxide, such as indium tin oxide, and the lower electrode may include doped silicon. The retinomorphic sensor may include a resistor disposed in series with the retinomorphic sensor, and the retinomorphic sensor may have a decay time which is tunable in response to the value of the resistor. The decay time of the retinomorphic sensor may decrease with a decrease in the value of the resistor. In addition, the retinomorphic sensor may be configured to produce a response to a change in light level on the retinomorphic sensor without an input voltage applied to the retinomorphic sensor. In some exemplary configurations, the retinomorphic sensor may include an integrated vertical structure in which a resistor is disposed in a stack between a capacitor and a substrate and in electrical communication with the capacitor and substrate. The retinomorphic sensor may include an integrated vertical structure in which a transistor is disposed in a stack between a capacitor and a substrate and in electrical communication with the capacitor and substrate. Still further the present invention may provide an apparatus comprising an array of such retinomorphic sensors.

BRIEF DESCRIPTION OF THE DRAWINGS

The foregoing summary and the following detailed description of exemplary embodiments of the present invention may be further understood when read in conjunction with the appended drawings, in which:

FIG. 9A schematically illustrates a control device with organic semiconductor absorber layer omitted (left), measured with illumination between 0 and P=124 mW/cm² and a time-dependence of optical power density (P) incident-on a photosensitive capacitor (right) where $V_{in}$=0 V and R=100 kΩ;

FIG. 9B schematically illustrates a full retinomorphic sensor (with organic semiconductor absorber) (left), measured with illumination between 0 and P=0.35 mW/cm² and output voltage of organic retinomorphic sensor ($V_{out}$) as a function of time, where $V_{in}$=0 V and R=100 kΩ;

FIG. 9C schematically illustrates a full retinomorphic sensor (with organic semiconductor absorber) (left), measured with illumination between P=123.92 mW/cm² and P=124 mW/cm² (left), with R=100 kΩ. $V_{in}$=5 V for the completed retinomorphic sensors (with organic semiconductor absorber) to show output voltage of the sensor ($V_{out}$) as a function of time, in response to incident square wave P;

DETAILED DESCRIPTION OF THE INVENTION

Figure 1A:
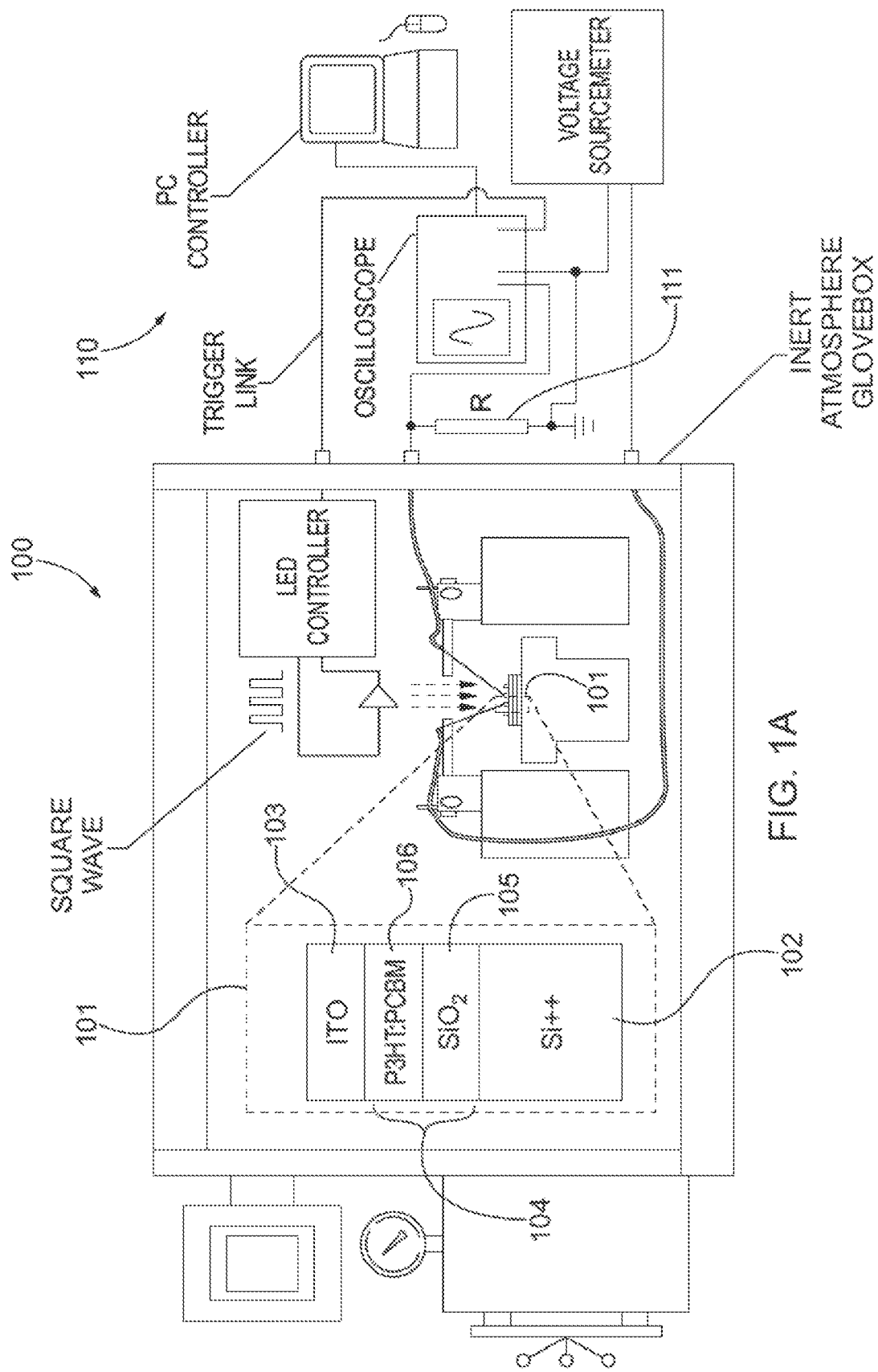
FIG. 1A schematically illustrates an exemplary device design and experimental setup in accordance with the present invention used to measure organic retinomorphic sensors, in which ITO is indium tin oxide, P3HT is poly(3-hexylthiophene-2,5-diyl), PCBM is phenyl-C61-butyric acid methyl, $SiO_2$ is silicon dioxide, $Si^{++}$=highly doped silicon, LED=light emitting diode, and PC=personal computer.

In an early prototype of a retinomorphic sensor, we used a metal halide perovskite absorber layer which was employed as one layer of a bilayer dielectric in a photosensitive capacitor. When placed in series with a resistor, and a voltage applied across the resistor-capacitor circuit, the device was found to output a voltage in response to changes in illumination, but produced zero voltage under constant illumination. The behavior was tested by applying a step-change in optical power density, resulting in a spike in output voltage followed by a monoexponential decay. However, while a valuable proof-of-concept demonstration, our initial sensors had two serious drawbacks. Firstly, the semi-transparent gold top contact had to be thin (15 nm) to enable optical access to the absorber layer. This resulted in a very high contact resistance, which in-turn caused a large decay constant (on the order of 100 ms) that could not be controlled through a choice of external resistor. Secondly, the devices exhibited significant instability under constant biasing conditions. Specifically, the magnitude of the output voltage spike changed as function of time under constant bias. Bias-stress instabilities are widely observed in metal halide perovskite solar cells, and often attributed to a voltage-induced redistribution of mobile ions. We interpret our observations as being analogous to those observed in metal halide perovskite field effect transistors (FETs), where ionic screening is believed to inhibit electronic charge accumulation.

Here we present an alternative device structure, employing an organic semiconductor blend as the absorber layer and a transparent conducting oxide (TCO) as the top electrode. TCOs combine high electrical conductivity with high optical transparency, and are widely employed in solar cells as transparent electrodes. In our devices they can enable much thicker electrodes to be deposited than with gold, potentially reducing contact resistance. Organic semiconductors are more mature, and in general exhibit better stability, than metal halide perovskites. Importantly, because our retinomorphic sensors produce a signal as a result of changes in capacitance, not current flow, charges only have to be present, and not necessarily mobile, to contribute to the output voltage. This suggests that, while the mobility of charge carriers in organic semiconductors is generally at least an order of magnitude lower than it is in metal halide perovskites, it is also expected to be a much less influential parameter in retinomorphic sensors than in organic FETs (OFETs) or organic photovoltaics (OPVs), where charges must travel through the material to contribute to current. Organic semiconductors in general have a higher exciton binding energy than metal halide perovskites. This means, that while absorption is similar, the number of photogenerated free carriers may be lower in organic semiconductors under identical illumination conditions. However, exciton dissociation can be enhanced by optimizing the micromorphology of bulk heterojunction organic systems. It is therefore believed that organic semiconductors offer a good tradeoff between stability and performance for retinomorphic sensors.

Referring now to the figures, wherein like elements are numbered alike throughout, a depiction of an exemplary device structure 100 and measurement setup 110 in accordance with the present invention is shown in FIG. 1A. A capacitor 101 may include a highly doped silicon ($Si^{++}$) bottom electrode 102 with a concentration of $>=10^{17}$ dopant atoms per $cm^3$, an indium tin oxide (ITO) top electrode 103, and a bilayer dielectric 104. The bottom dielectric layer 105 may be silicon dioxide ($SiO_2$), which is highly resistive, stable, and irresponsive to optical illumination. The top semiconductor layer 106 a 50:50 (weight %) blend of the p-type polymer poly(3-hexylthiophene-2,5-diyl) (P3HT) and the n-type small molecule phenyl-C61-butyric acid methyl (PCBM). Organic semiconductor blends such as P3HT:PCBM are strong absorbers of visible light. General class=organic donor:acceptor semiconductor blends. Another prototypical example would be "pentacene:C60 bilayers."

To test the capacitor 101, the capacitor 101 was placed in series with a conventional resistor 111 of resistance R, and a constant input voltage ($V_{in}$) was applied across the capacitor-resistor circuit. Light was applied to the capacitor 101 as a square wave of frequency f, with an incident optical power density between 0 and P. The voltage across the resistor 111 ($V_{out}$) was measured as a function of time with an oscilloscope. While organic semiconductors are more air stable than many metal halide perovskites, the electronic performance of some (primarily n-type) organic semiconductors degrade in the presence of oxygen. This is generally believed to be a solvable problem in the long term, either through material approaches or purpose-designed encapsulation, but it is a potential source of systematic experimental error and/or ambiguity which we can eliminate in this disclosure, and we hence carried out all measurements under ambient pressure $N_2$.

Figure 1B:
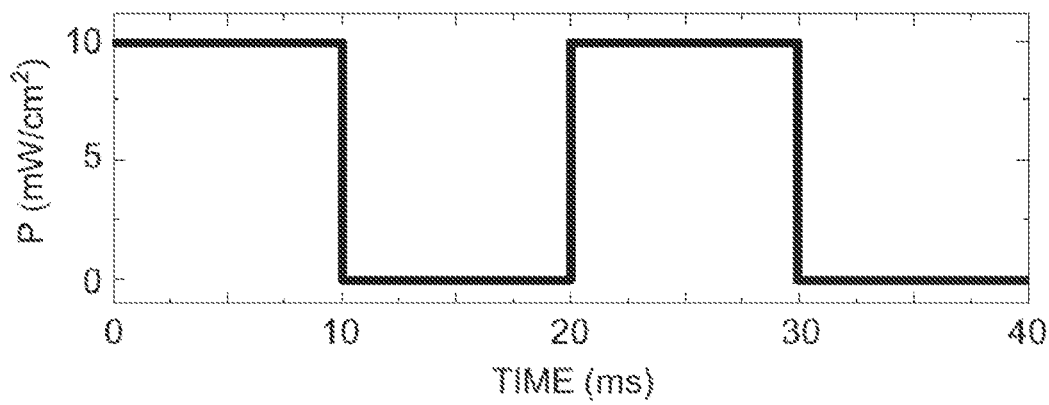
FIG. 1B illustrates an exemplary optical power density (P) incident on a photosensitive capacitor in accordance with the present invention as a function of time.
Figure 1C:
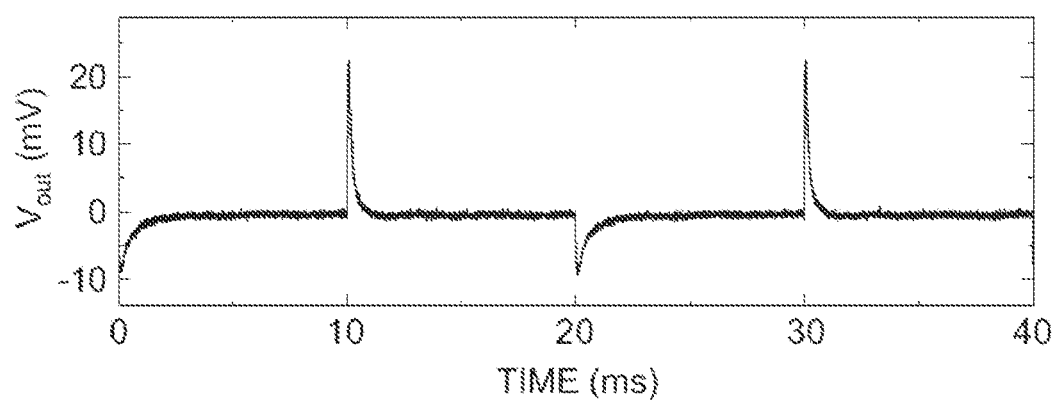
FIG. 1C illustrates an exemplary response of an organic retinomorphic sensor in accordance with the present invention, voltage across resistor ($V_{out}$) as a function of time, in response to the incident square wave P of FIG. 1B.

An example of the waveform applied to the capacitor 101 is shown in FIG. 1B, and the resulting sensor output is shown in FIG. 1C. Here R=100 kΩ, f=50 Hz, and $V_{in}$=5V. We see that the capacitor 101 produces the desired behavior: a spike in voltage when the light is turned on or off, but otherwise the voltage is close to 0 V. Unexpectedly, we observe that $V_{out}$ is negative when the light turns on and positive when the light turns off. Additionally, the magnitude of the spike is asymmetric between turn-on and turn-off signals. These unexpected results are discussed towards the end of this disclosure.

Figure 1D:
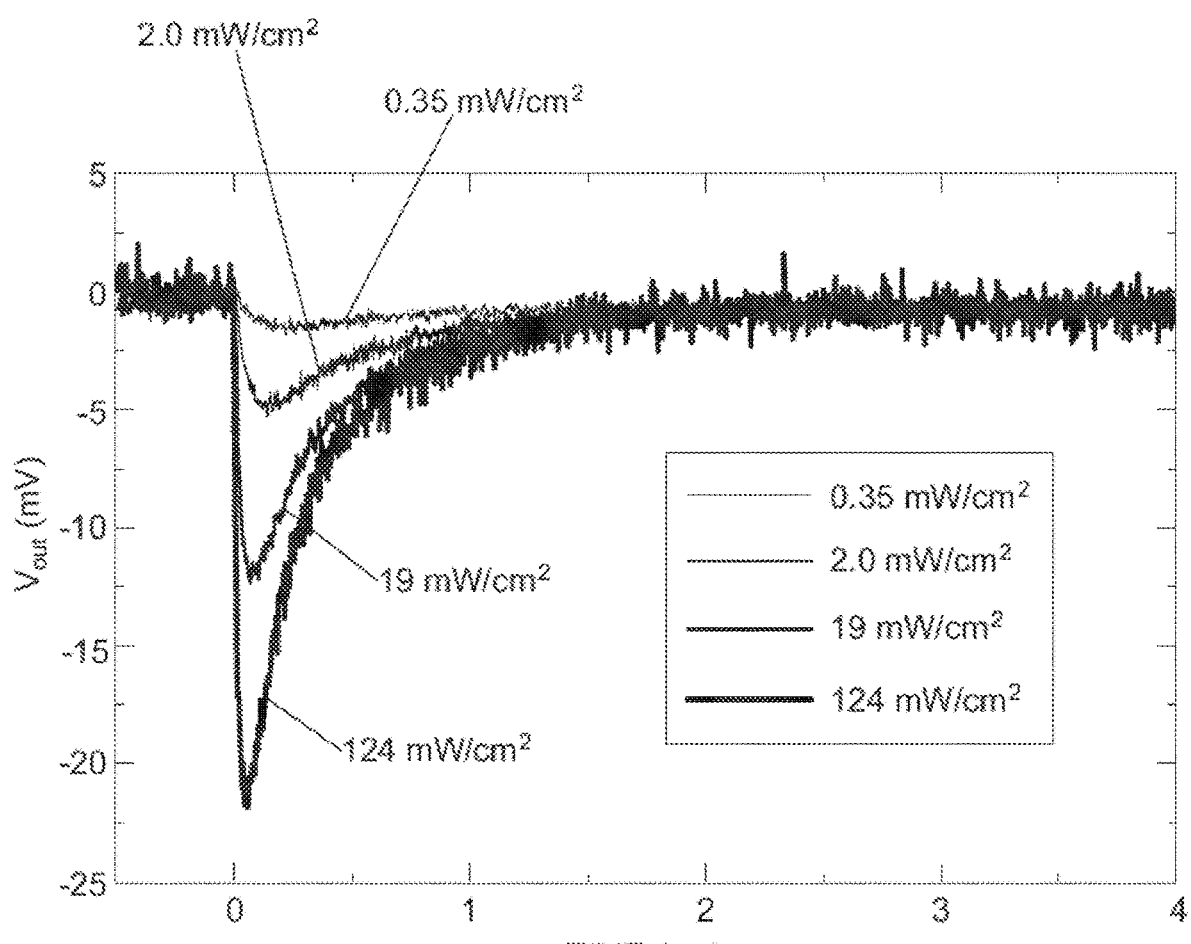
FIG. 1D illustrates an exemplary response of an organic retinomorphic sensor in accordance with the present invention to a step change increase in incident optical power density from 0 to P, at time=0, for various values of P.
Figure 1E:
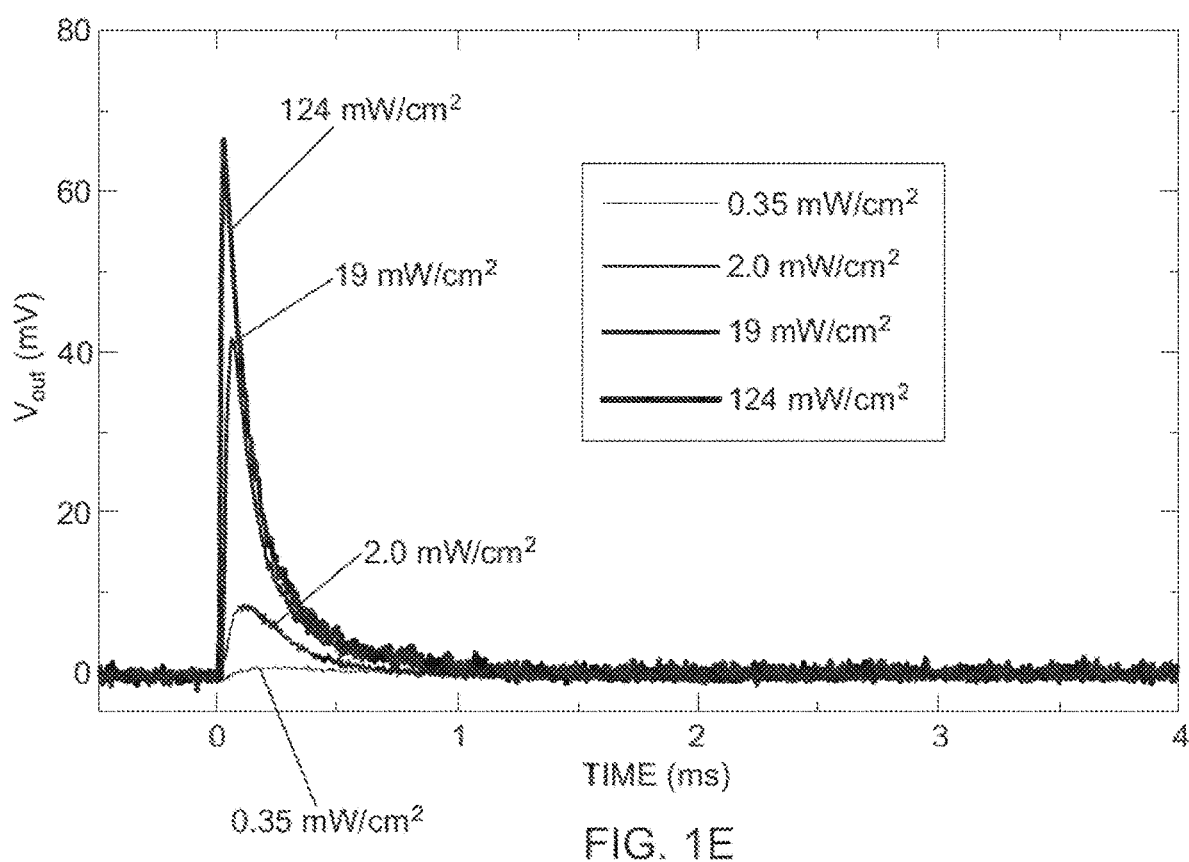
FIG. 1E illustrates an exemplary response of an organic retinomorphic sensor in accordance with the present invention to a step change decrease in incident optical power density from P to 0, at time=0, for various values of P.
Figure 1F:
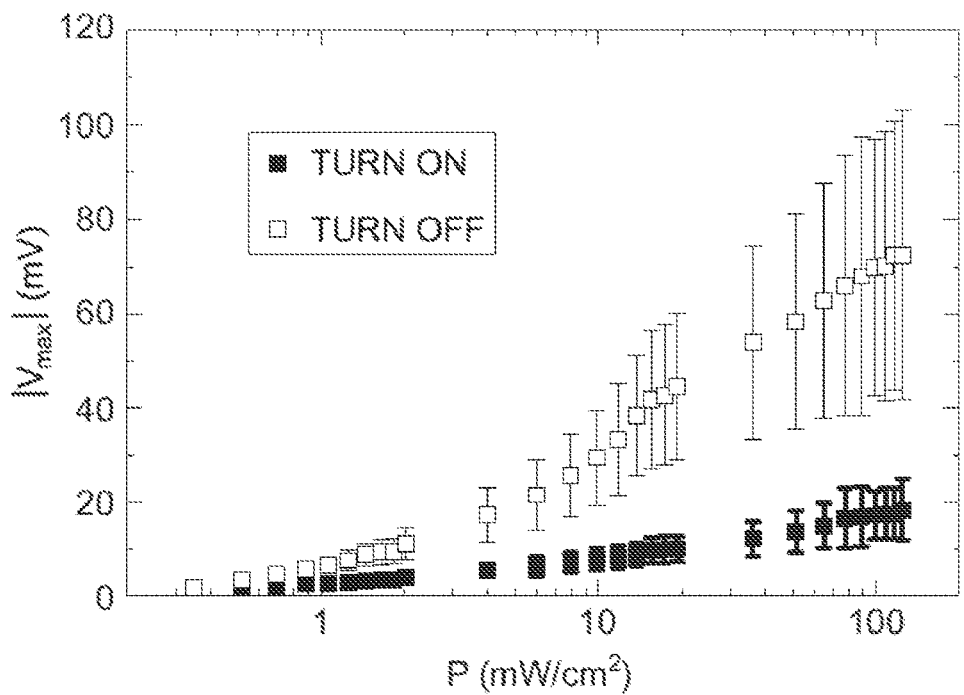
FIG. 1F illustrates the mean maximum magnitude of output voltage, $|V_{max}|$, of 3 different organic retinomorphic sensors in accordance with the present invention as a function of P, where error bars denote standard deviation between devices.
Figure 1G:
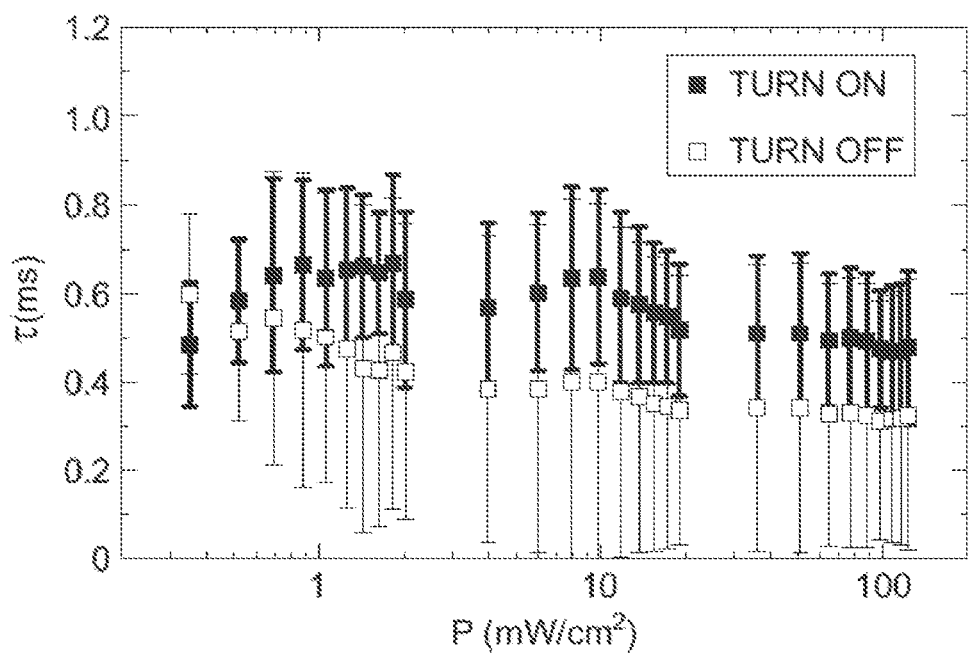
FIG. 1G illustrates a mean decay constant of $|V_{out}|$ of 3 organic retinomorphic sensors in accordance with the present invention, r as a function of P, extracted assuming a monoexponential decay, where error bars denote standard deviation between devices and $V_{in}$=5V and R=100 kΩ in all cases.

The magnitude of the voltage spike increased with increasing P. FIG. 1D shows 4 examples of $V_{out}$ as a function of time in response to a step change in light intensity from 0 to four different values of P. FIG. 1E shows equivalent data in response to a step change reduction in light intensity from four different values of P to 0. FIG. 1F shows the magnitude of the maximum value of $V_{out}$, denoted $|V_{max}|$, as a function of P, for three identically prepared devices. While the device-to-device variation is significant, the behavior is similar in all devices: a negative $V_{out}$ as the light is turned on, a positive $V_{out}$ as the light is turned off, and a larger $|V_{max}|$ when the device is turned off compared to when it is turned on. The decays were found to fit a monoexponential decay function (see FIGS. 5A-5H for example), from which a characteristic decay time ($\tau$) could be extracted. These values of $\tau$ are plotted as a function of P in FIG. 1G. As with $|V_{max}|$, variation in r between devices was significant, however all devices exhibited $\tau$ between 100 μs and 1 ms, a small decrease with increasing P, and a slightly larger $\tau$ for turning on compared to turning off. An increase in bimolecular and Auger recombination at higher P is a possible explanation of the dependence of $\tau$ on P.

Figure 2A:
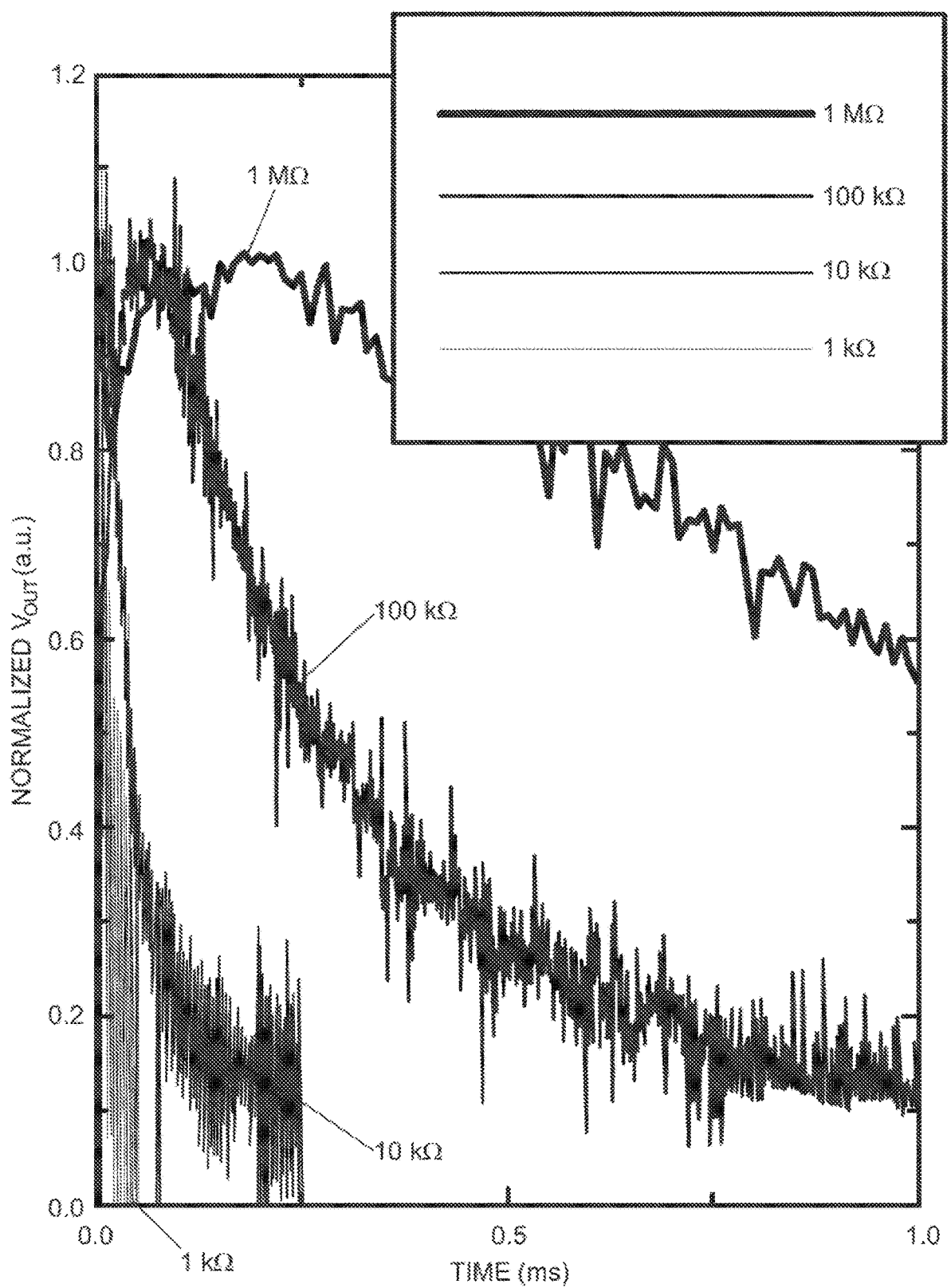
FIGS. 2A-2B illustrate output voltage, $V_{out}$, of an organic retinomorphic sensor in accordance with the present invention measured as a time, normalized between 0 and 1, in response to a step-change in optical power density from 0 to P=124 mW/cm² (FIG. 2A), and from P=124 mW/cm² to 0 (FIG. 2B), for various values of external resistor, R.
Figure 2B:
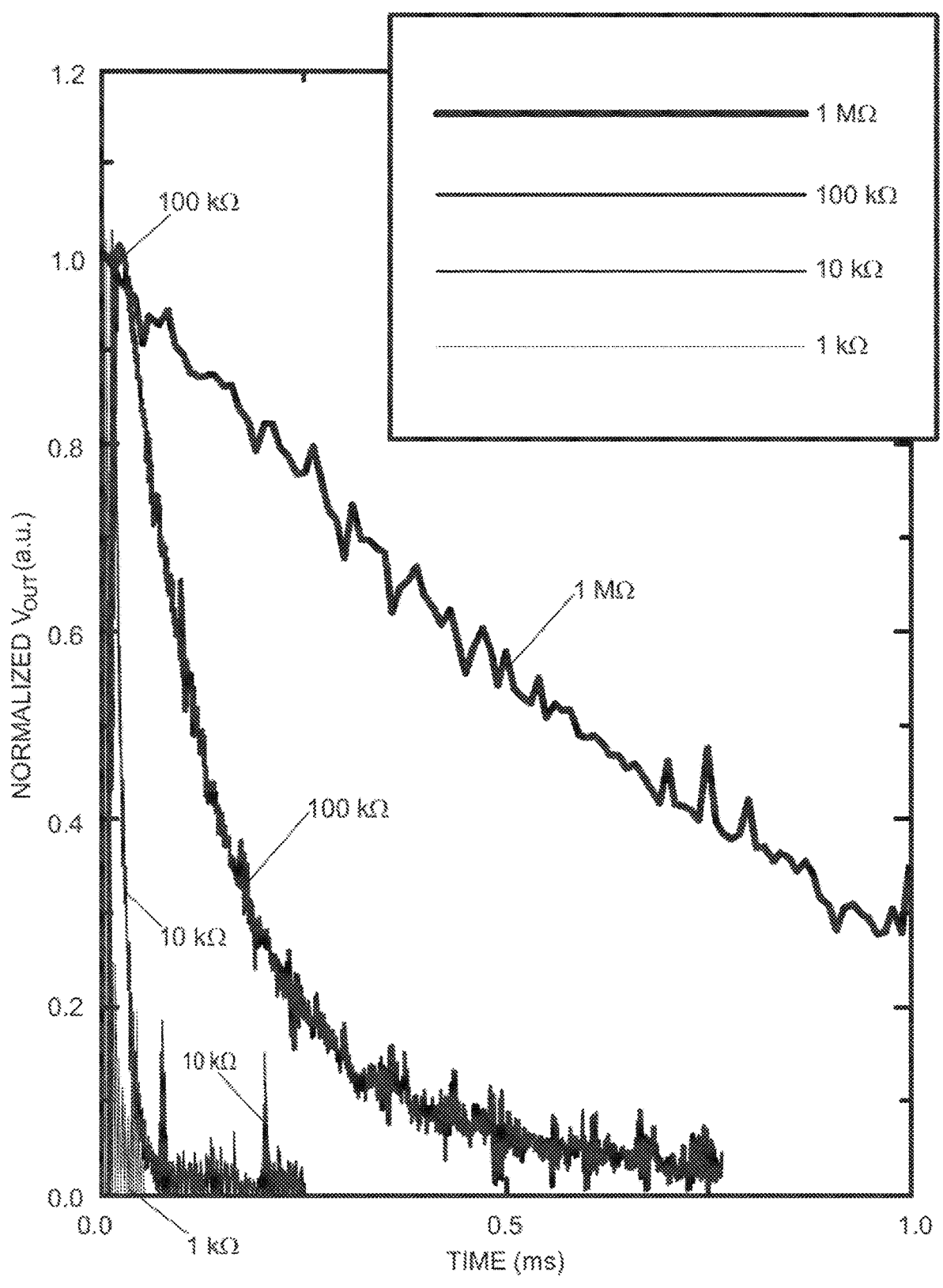
Figure 2C:
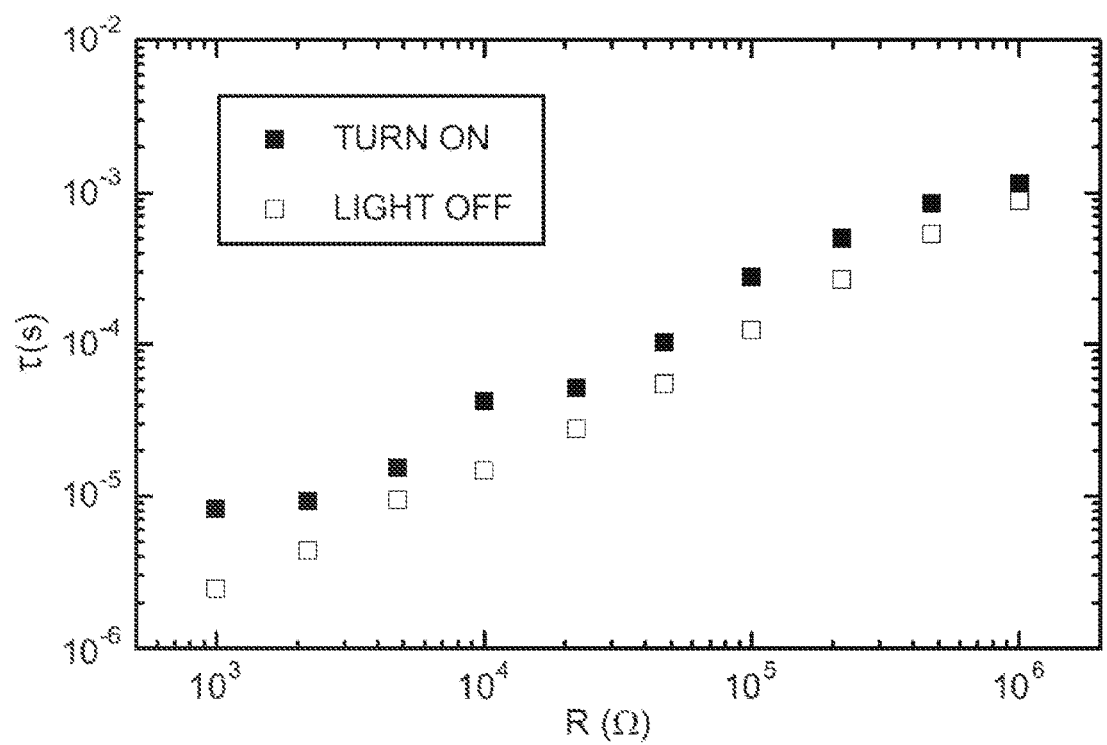
FIG. 2C illustrates a decay constant of an organic retinomorphic sensor in accordance with the present invention, r as a function of R, extracted assuming a monoexponential decay, in response to light applied as a step function from 0 to P=124 mW/cm² ("TURN ON"), and from P=124 mW/cm² to 0 ("TURN OFF")

It is noteworthy that the rapid response time of the capacitors 101 suggests to us that the ITO top electrode has indeed reduced the contact resistance of the structure. The values of $\tau$ shown in FIG. 1G were all evaluated using the same external resistor, R=100 kΩ. One attractive feature of our capacitors 101 is that they should have a r which is tunable through a choice of R. FIG. 2A shows normalized $|V_{out}|$ as a function of time in response to turning the light on from 0 to P=124 mW/cm², for four different values of R. FIG. 2B shows the equivalent data when the light is turned off from P=124 mW/cm² to 0. As expected, $\tau$ decreases as R decreases. FIG. 2C shows $\tau$ as a function of time in response to both turning the light on and turning the light off. The rise time of $|V_{out}|$ was also approximated as a function of R in FIG. 5G. The rise time increased with R, and was higher for when the light was turned on compared to when it was turned off.

Figure 2D:
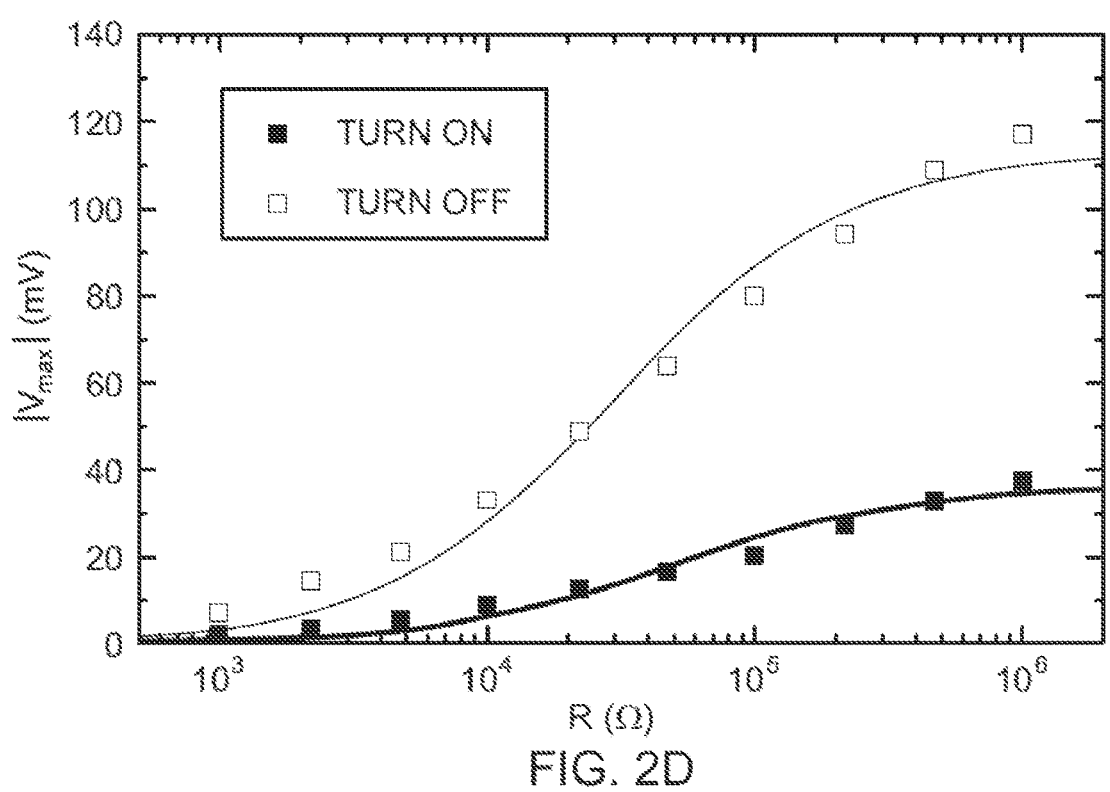
FIG. 2D illustrates a magnitude of peak output voltage, $|V_{max}|$, of an organic retinomorphic sensor in accordance with the present invention as a function of R, in response to light applied as a step function from 0 to P=124 mW/cm² ("TURN ON"), and from P=124 mW/cm² to 0 ("TURN OFF"), with the lines fit to a simple potential divider model where the device is assumed to have a constant contact resistance and where $V_{in}$=5V in all cases.

In addition to T, $|V_{max}|$ was also observed to decrease as R was decreased, as shown in FIG. 2D. This is expected for a device with a finite contact resistance, as the external resistor R, and the contact resistance $R_C$, will act as a potential divider, with only the voltage dropped across R being measurable as $V_{out}$. The dependence of $|V_{max}|$ on R was modelled using the equation for a potential divider, and assuming a constant $R_C$ for turn-on and a constant $R_C$ for turn-off. These fits are shown as the lines in FIG. 2D. The fits yield values of 50 kΩ for turn on and 31 kΩ for turn off. The discrepancy between the two values, and the sub-optimal fit, are likely due to the fact that this simple model neglects the non-Ohmic nature of the injection barrier.

The fastest $\tau$ measured was 8 μs in response to the light turning on, and 3 μs in response to the light turning off, comparable to the equivalent rise times, FIG. 2C. This suggests that such sensors could potentially resolve objects that spend <10 μs in the visual field, enabling tracking of extremely high velocity objects. It is anticipated that this number could be improved further by reducing the device area, increasing the $SiO_2$ and/or semiconductor thickness, or by optimizing the interfaces for a low $R_C$.

Figure 3A:
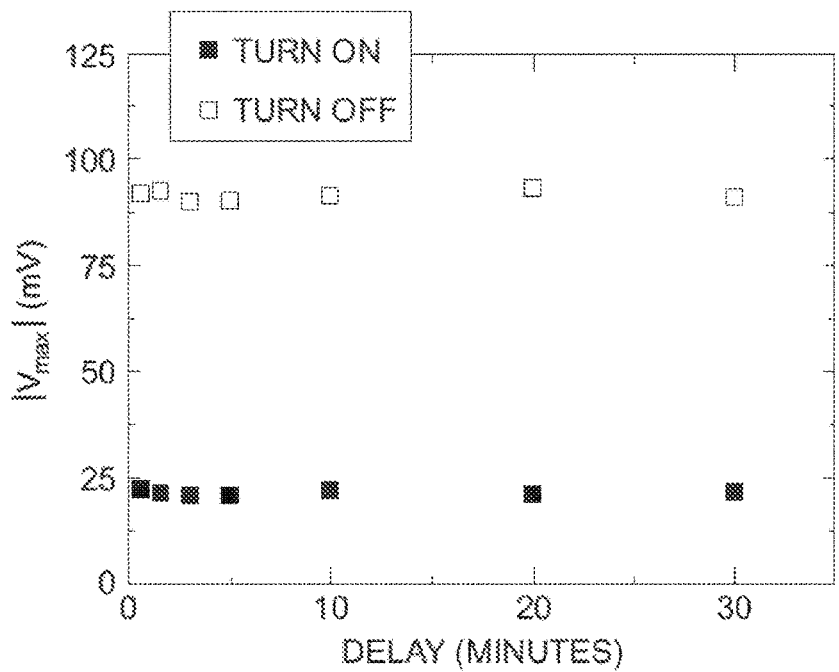
FIG. 3A illustrates a magnitude of peak output voltage, $|V_{max}|$, of an organic retinomorphic sensor in accordance with the present invention as a function time after application of $V_{in}$=5V and square wave of optical power density between 0 and P=124 mW/cm², where "TURN ON" indicates the response to the light being applied and "TURN OFF" indicates the response to the light being withdrawn.
Figure 7A:
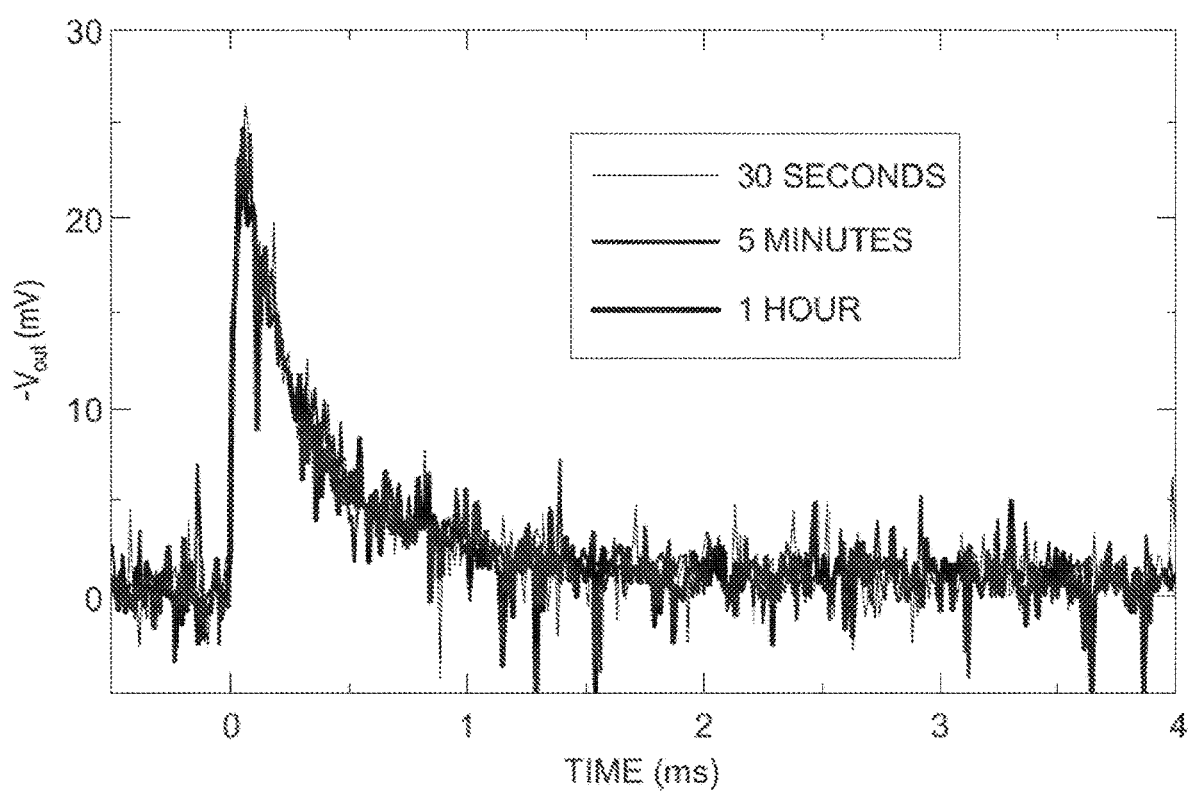
FIGS. 7A, 7B illustrate an output voltage of retinomorphic sensor, $-V_{out}$, as a function of time in response to an increase in light intensity from 0 to P=124 mW/cm² (FIG. 7A), and a decrease in light intensity from P=124 to 0 mW/cm² (FIG. 7B), for three different times after application of $V_{in}$=5V and optical illumination with R=100 kΩ.
Figure 7B:
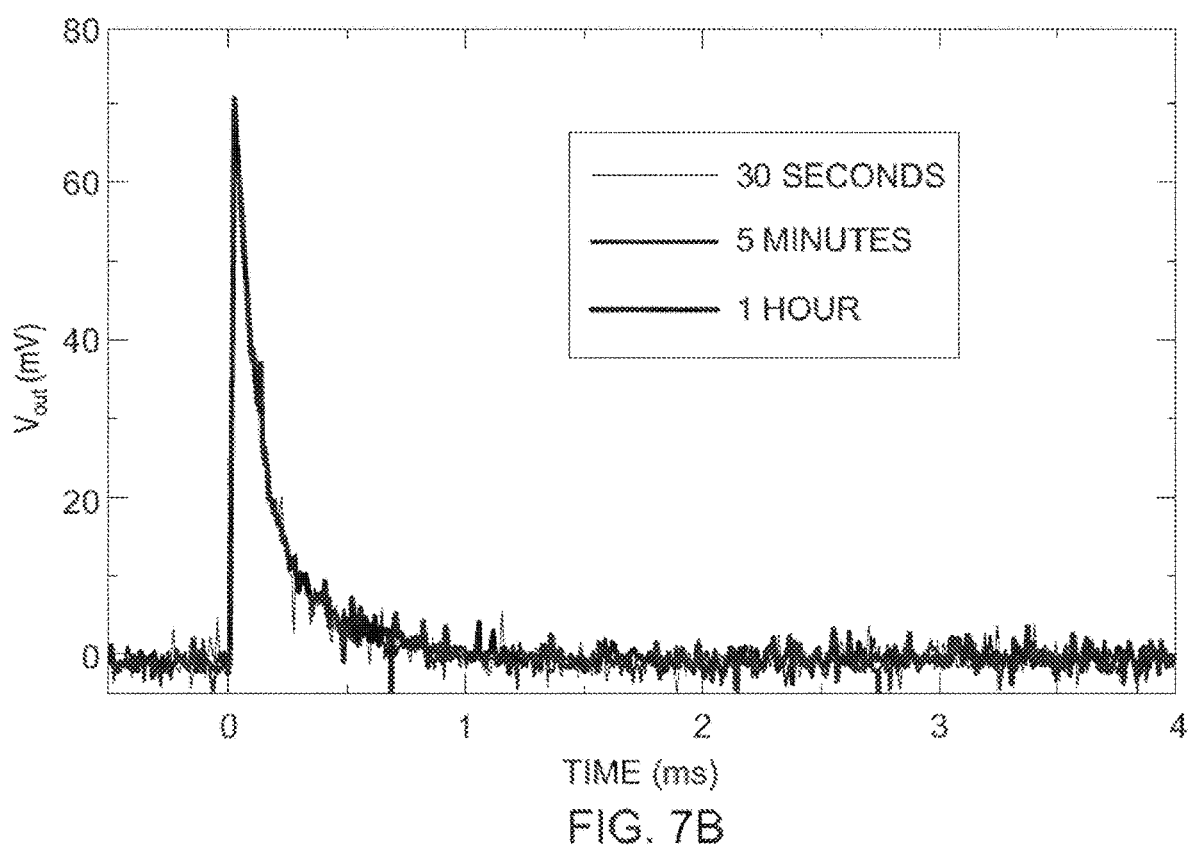

One of the primary motivations for considering organic semiconductors rather than metal halide perovskites is that they are hoped to exhibit better stability under constant bias. This was tested by simultaneously applying the input voltage $V_{in}$, and the square wave of light, then measuring the magnitude of the peak output voltage as a function of time. This is shown in FIG. 3A. No significant variations in $|V_{max}|$, or form of the response $V_{out}$ response (see FIGS. 7A, 7B), were observed over a period of 1 hour. Longer term studies will be valuable, but we have here demonstrated significant stability improvements over a metal halide perovskite based sensor, which was unstable after a matter of seconds.

Figure 3B:
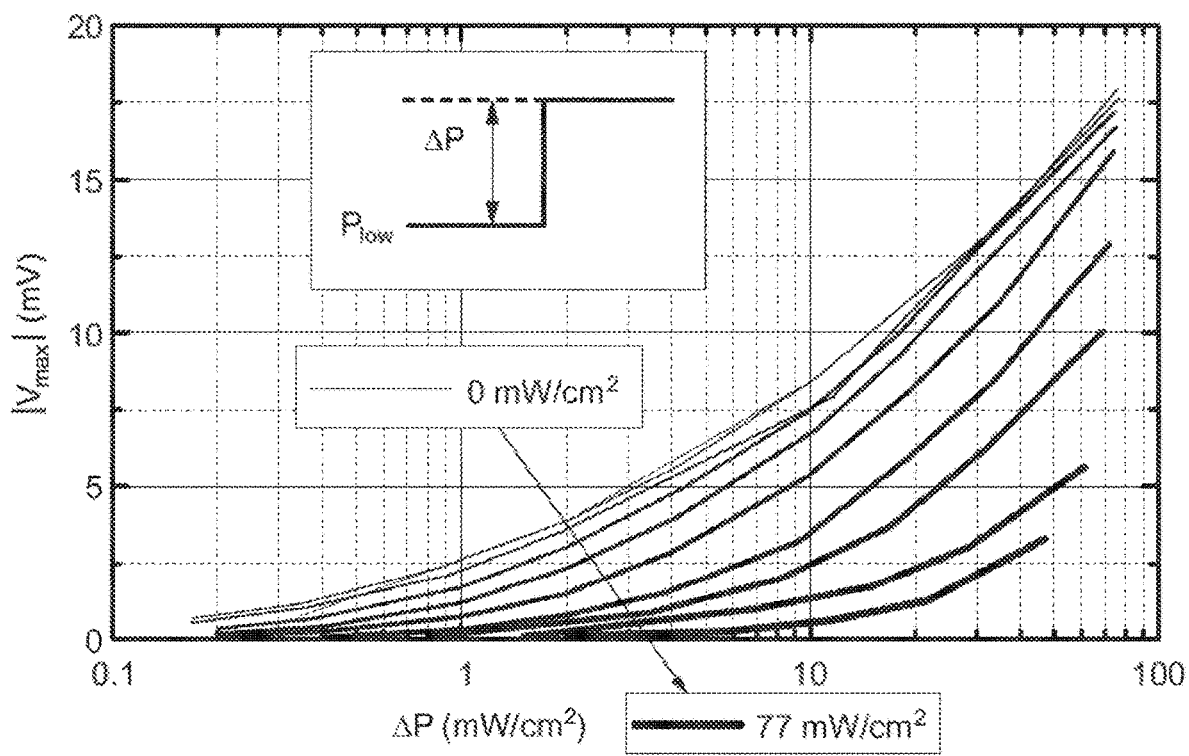
FIG. 3B illustrates a magnitude of peak output voltage, $|V_{max}|$, of an organic retinomorphic sensor in accordance with the present invention in response to an increase in light intensity from $P_{low}$ to $P_{low}+\Delta P$ as a function of $\Delta P$, with $P_{low} \cdot V_{in}$=5V and R=100 kΩ in all cases.
Figure 3C:
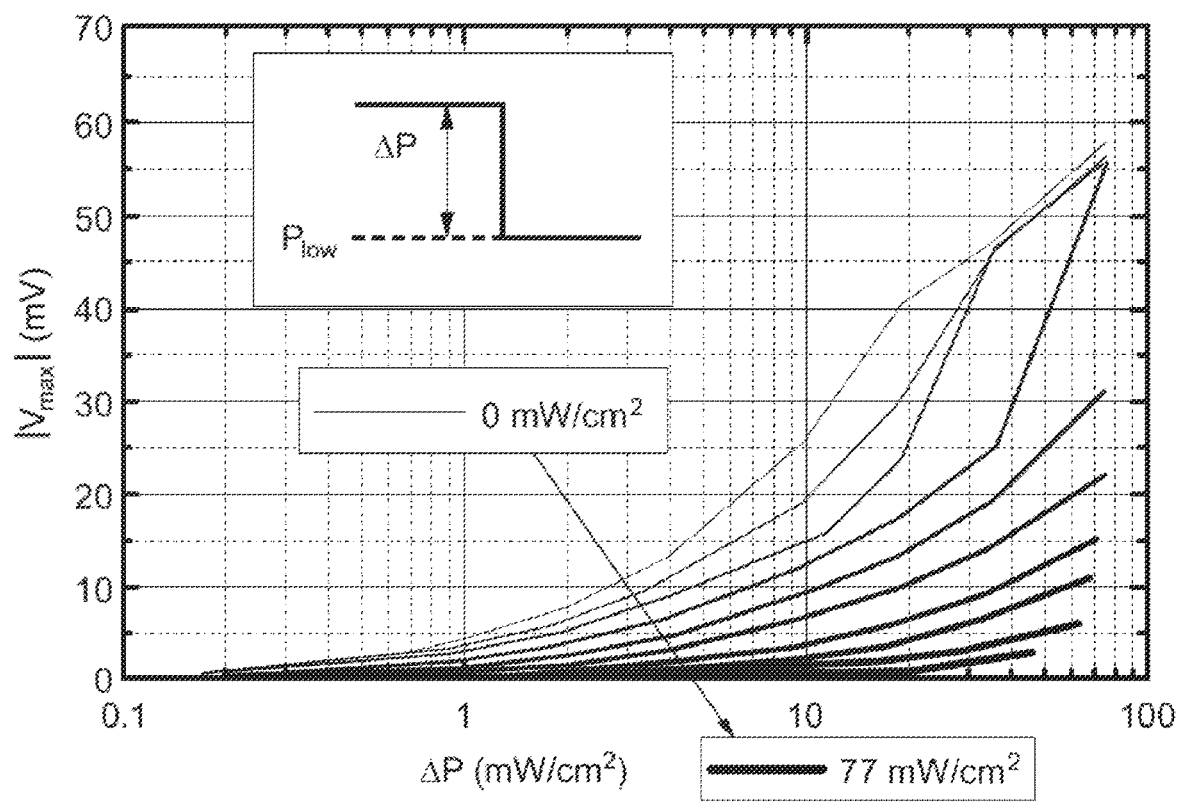
FIG. 3C illustrates a magnitude of peak output voltage, $|V_{max}|$, of an organic retinomorphic sensor in accordance with the present invention in response to a decrease in light intensity from $P_{low}+\Delta P$ to $P_{low}$ as a function of $\Delta P$, with $P_{low} \cdot V_{in}$=5V and R=100 kΩ in all cases.

Up until now the capacitors 101 have only been tested with very low background light intensities (ambient laboratory light), approximated as 0 mW/cm². For real world applications, it will be important to produce signals in response to changes between two non-zero power densities. FIG. 3B shows the measured $|V_{max}|$ as a result of discontinuously increasing the incident optical power density from a low value ($P_{low}$) to a high value ($P_{low}+\Delta P$), as a function of $\Delta P$. Equivalent data is shown in FIG. 3C for a step-change from $P_{low}+\Delta P$ to $P_{low}$. This was carried out for a range of $P_{low}$, between 0 and 77 mW/cm². The strength of the output signal falls as $P_{low}$ increases. This behavior is not unexpected, since the charge density in most semiconductors is known to obey a power-law relationship with optical power density, implying that capacitance $C \propto P^\gamma$. Here $\gamma$ is a dimensionless exponent, which is close to 0.5 for systems dominated by bimolecular recombination. This suggests that the ability to resolve signal decreases for high irradiance environments. However, because our capacitor 101 produces a signal around zero under constant illumination, amplification strategies should be significantly more straightforward than trying to resolve two similar, non-zero, currents from a photodiode.

Figure 4A:
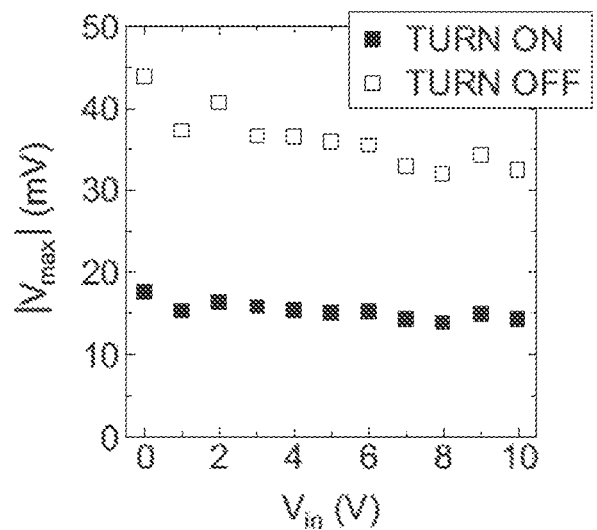
FIG. 4A illustrates a magnitude of peak output voltage, $|V_{max}|$, of an organic retinomorphic sensor in accordance with the present invention as a function of input voltage, $V_{in}$, and square wave of optical power density in response to light applied as step function from 0 to P=124 mW/cm² ("TURN ON"), and from P=124 mW/cm² to 0 ("TURN OFF"), where R=100 kΩ.
Figure 4B:
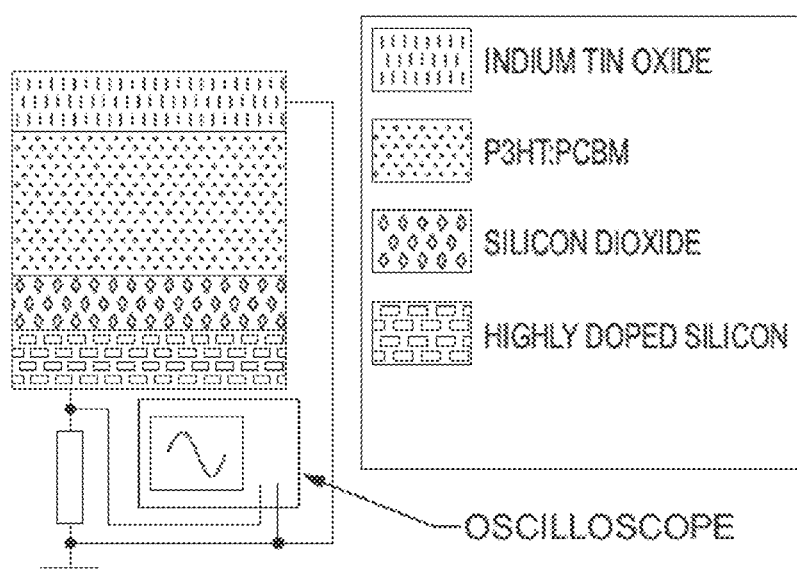
FIGS. 4B-4I schematically illustrate a proposed operating mechanism for organic retinomorphic sensor with grounded top electrode in accordance with the present invention in response to application of light (FIGS. 4B-4E) and removal of light (FIGS. 4F-4I)
Figure 4C:
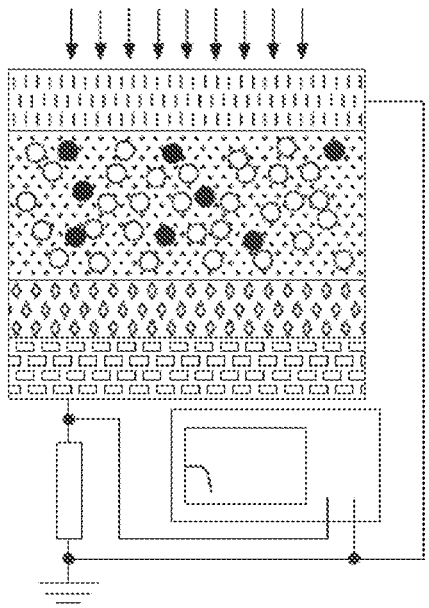
Figure 4D:
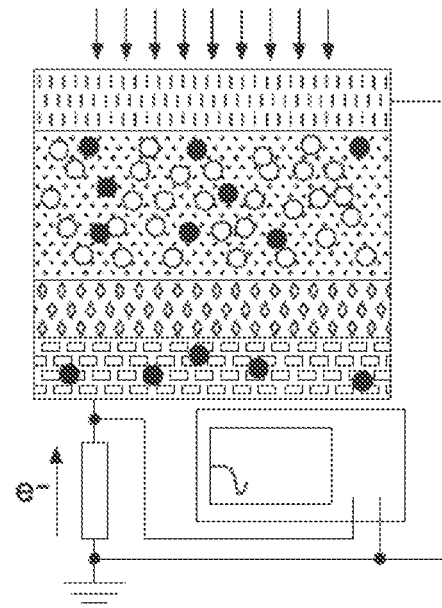
Figure 8A:
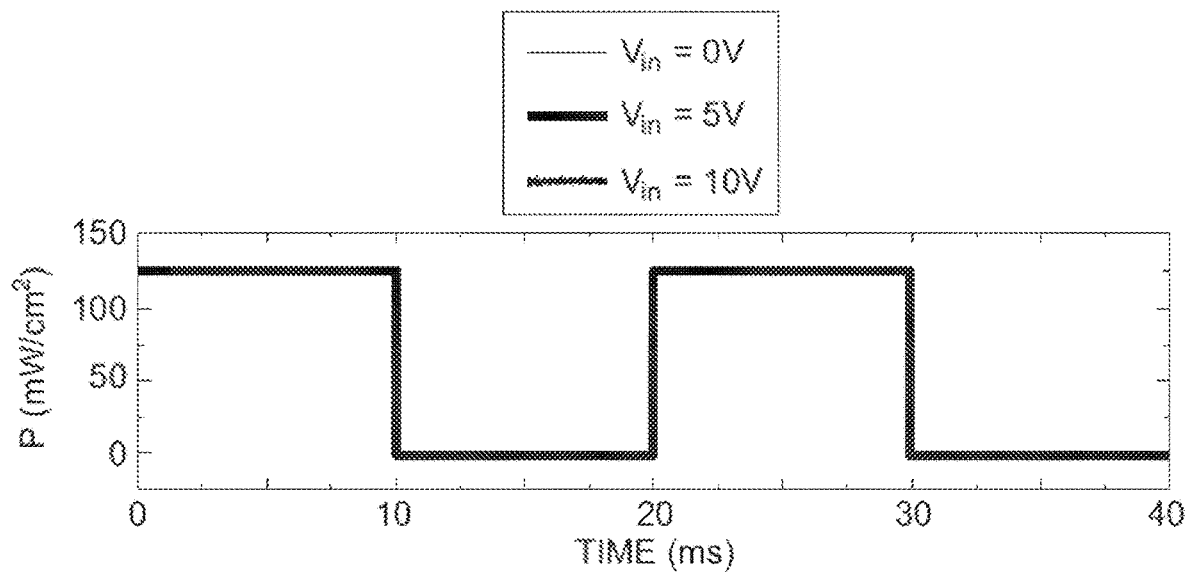
FIG. 8A illustrates time-dependence of optical power density (P) incident on a photosensitive capacitor.
Figure 8C:
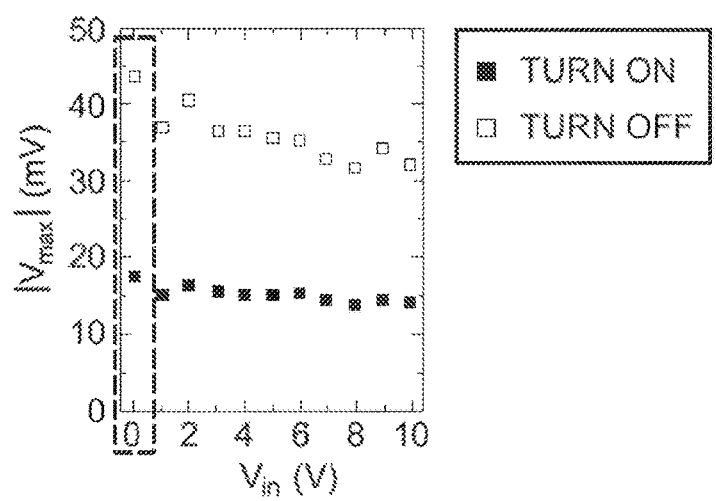
FIG. 8C illustrates device operation at zero applied voltage.
Figure 8B:
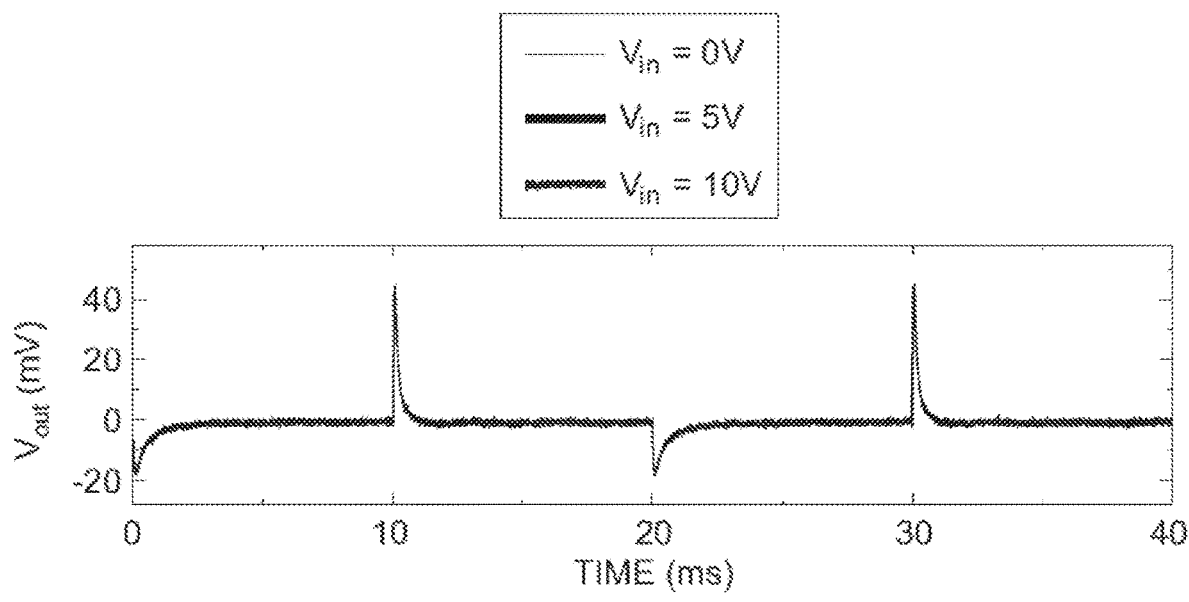
FIG. 8B illustrates output voltage of organic retinomorphic sensor ($V_{out}$) as a function of time, in response to incident square wave P for various values of input voltage ($V_{in}$) R=100 kΩ.

Finally, the response of these capacitors 101 was measured as a function of input voltage, $V_{in}$. FIG. 4A shows $|V_{max}|$ measured as a function of $V_{in}$, in response to a step change in intensity between 0 and P=124 mW/cm². Surprisingly, the magnitude of the peak, and the general form of response (see FIGS. 8A, 8B), was largely unaffected by the applied voltage. Even when $V_{in}$=0, i.e. when the top electrode 103 was grounded, the same response observed.

Figure 9A:
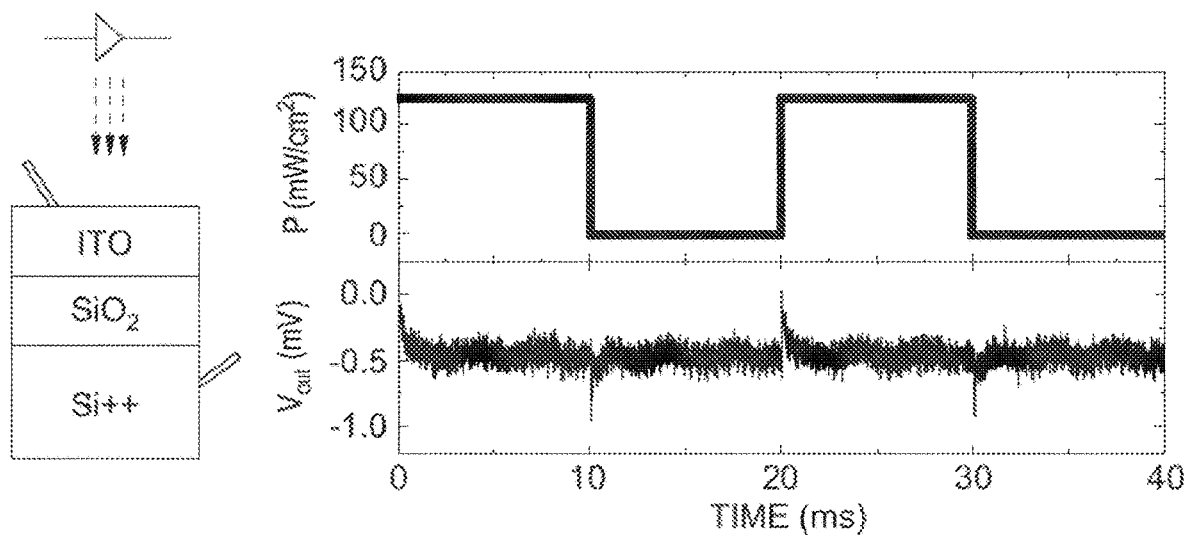
FIGS. 9A-9C schematically each illustrate on the left-hand side a diagram of capacitor and measurement setup.
Figure 9B:
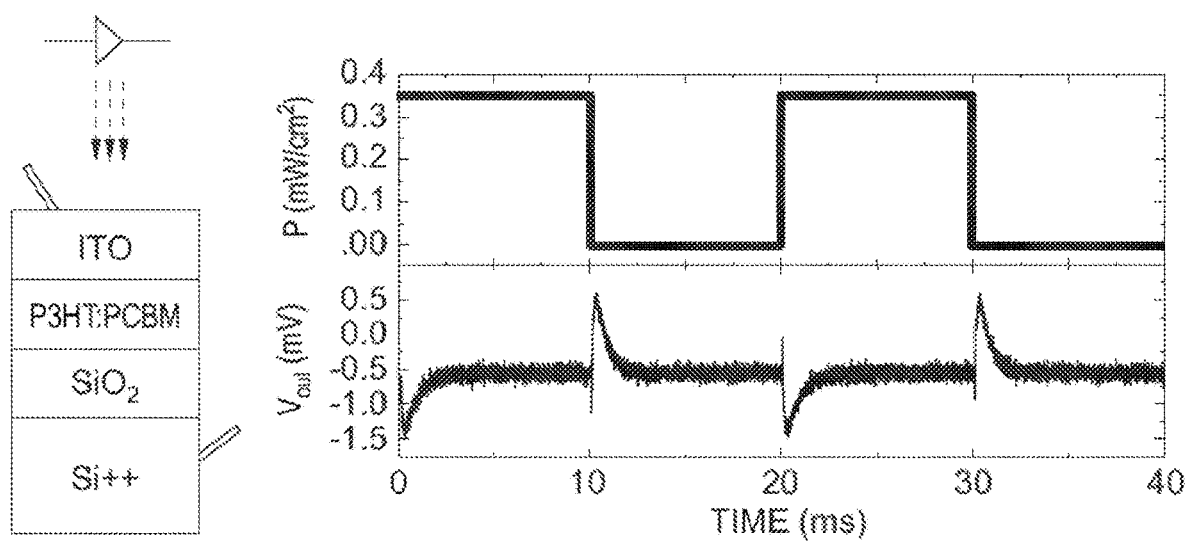
Figure 9C:
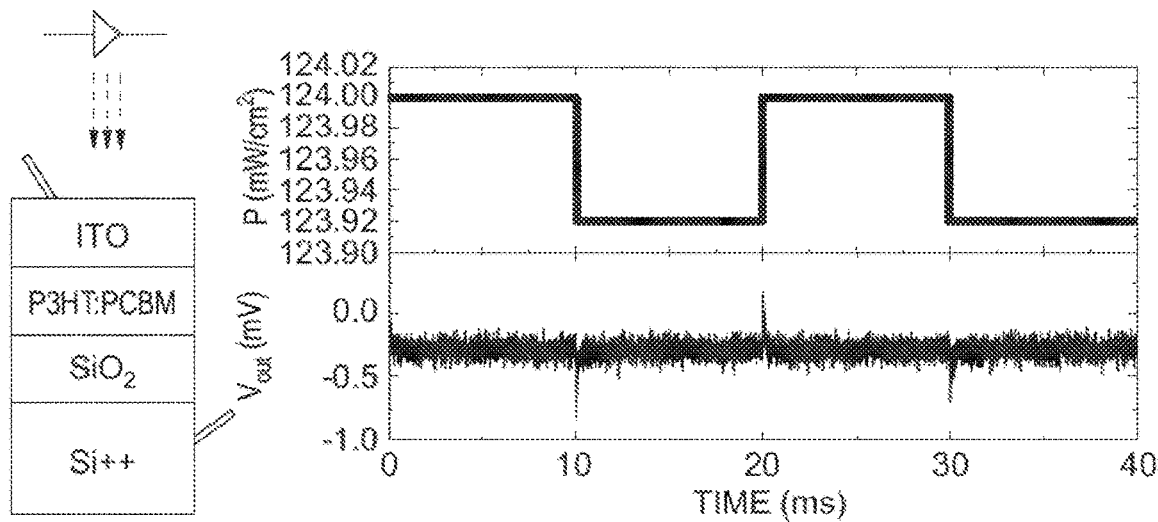
Figure 10A:
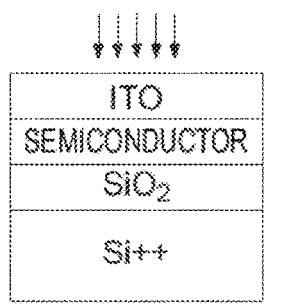
FIGS. 10A-10D schematically illustrate cross sectional diagrams of some simple retinomorphic sensor device structures in accordance with the present invention where the $Si^{++}$ is highly (degenerately) doped silicon to act as a metal.
Figure 10B:
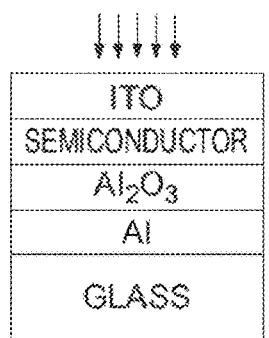
Figure 10C:
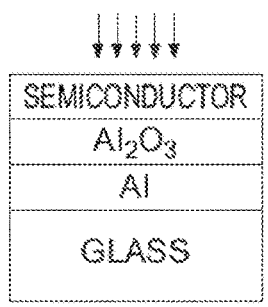
Figure 10D:
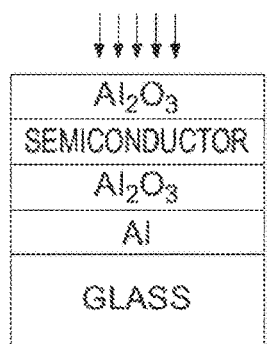

Control measurements were carried out with the P3HT:PCBM layer omitted from the structure, but with otherwise equivalent conditions. The results are shown in FIG. 9A. A small positive $V_{max}$ is observed when the light is turned on, and a small negative $V_{max}$ is observed when the light is turned off (the opposite signs to when the P3HT:PCBM is present). The magnitude of these voltages however are approximately $|V_{max}| \approx 500$ μV, roughly 100 times smaller than with the P3HT:PCBM is present. Peaks of a similar magnitude, and the same sign, are also visible when applying a very low light intensity (FIG. 9B) or a very small change in light intensity (FIG. 9C) to devices with the P3HT:PCBM present. For this reason, it is hypothesized that this phenomenon is likely an induction artefact due to the trigger signal (the cables ran in close proximity).

The observation that a non-zero $V_{out}$ is produced even when $V_{in}$=0 means the original description applied to metal halide perovskite retinomorphic sensors was incomplete. Our hypothesized mechanism for a grounded top electrode is shown in FIGS. 4B-4I. The mechanism relies upon the semiconductor having a dissimilar density of holes (p) and electrons (n) under constant illumination. This would be true if the monomolecular lifetimes of holes ($\tau_p$) and electrons ($\tau_n$) were unequal for example, as a result of asymmetries in trap density and/or depth. In the example depicted here we have hypothesized that $\tau_p > \tau_n$, resulting in p>n under constant illumination. Because the capacitor 101 is a capacitor, there only needs to be an asymmetry at the semiconductor-dielectric interface, not necessarily throughout the bulk. Bare $SiO_2$ is known to be a trap for electrons in OFETs, and passivation is normally applied when n-type organic semiconductors are employed in OFETs with $Si/SiO_2$ substrates.

This means that it is possible that the density of electrons at the interface may be lower than holes, even if the bulk concentrations are comparable.

The process of optical absorption and carrier generation in organic semiconductors is a complex topic, but in general free charge carriers are believed to be created ~100 fs to ~1 ps after photon absorption. For most of the data obtained, the period of the square wave (1/f) was ~10 ms. We can therefore approximate that charges are generated instantaneously when the light is applied. We have observed lifetimes of free carriers in P3HT:PCBM systems to be on the order of ~1 μs. We can therefore also assume that 1/f is much longer than $\tau_p$ and $\tau_n$ for the cases where R>>1 kΩ, which is what we consider for this model.

Figure 4E:
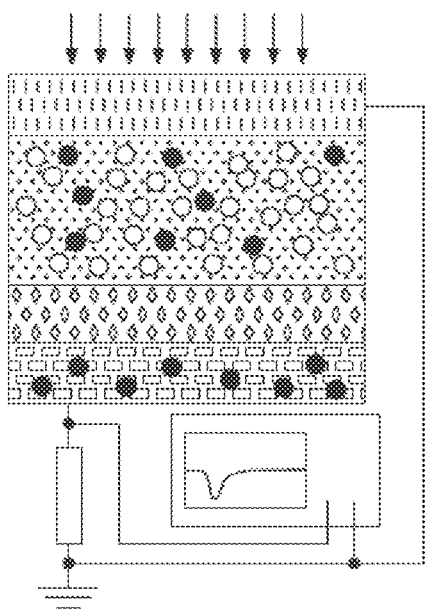
Figure 4F:
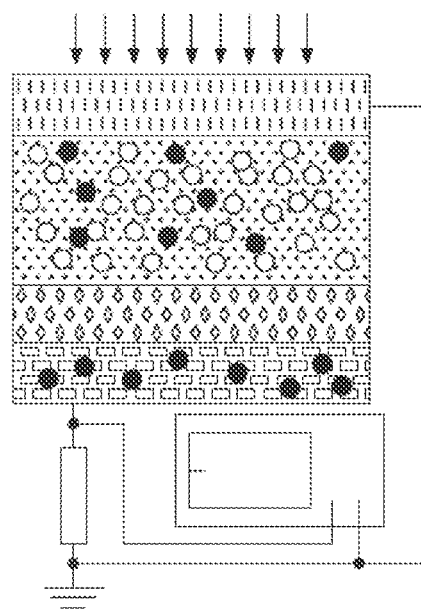
Figure 4G:
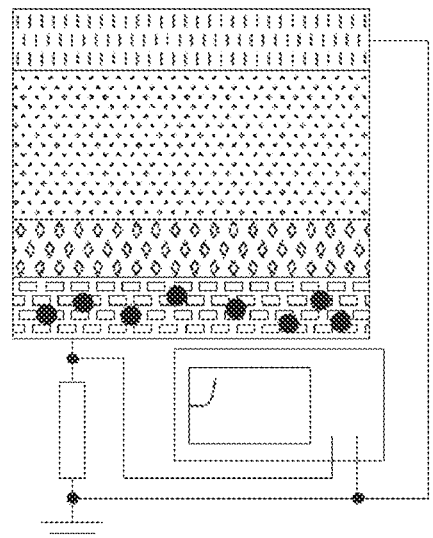
Figure 4H:
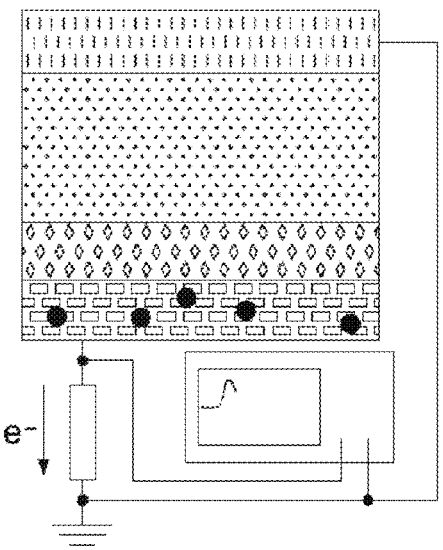
Figure 4I:
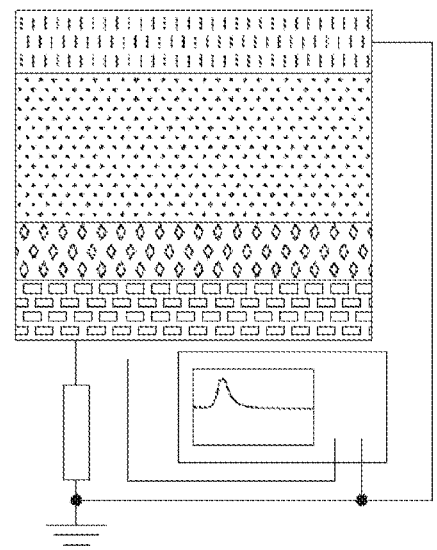
Figure 5A:
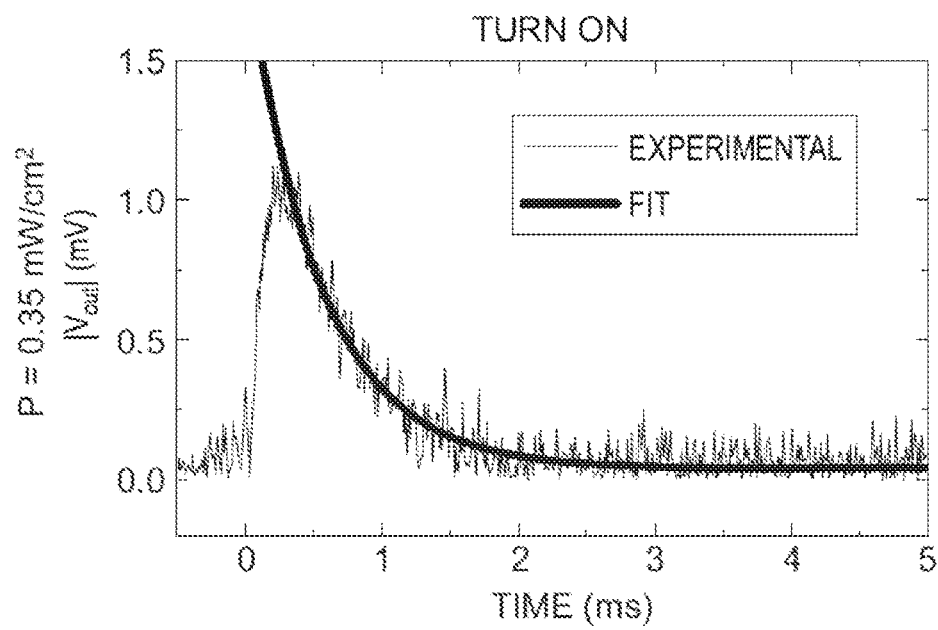
FIGS. 5A-5H illustrate a magnitude of output voltage of a prior retinomorphic sensor, $|V_{out}|$, as a function of time in response to (5A, 5C, 5E, 5G) a step function increase in light intensity from 0 to P mW/cm², and (5B, 5D, 5F, 5H) a step function decrease in light intensity from P to 0 mW/cm², for various values of P, with a fit to a monoexponential decay, and $V_{in}$=5V and R=100 kΩ in all cases.
Figure 5B:
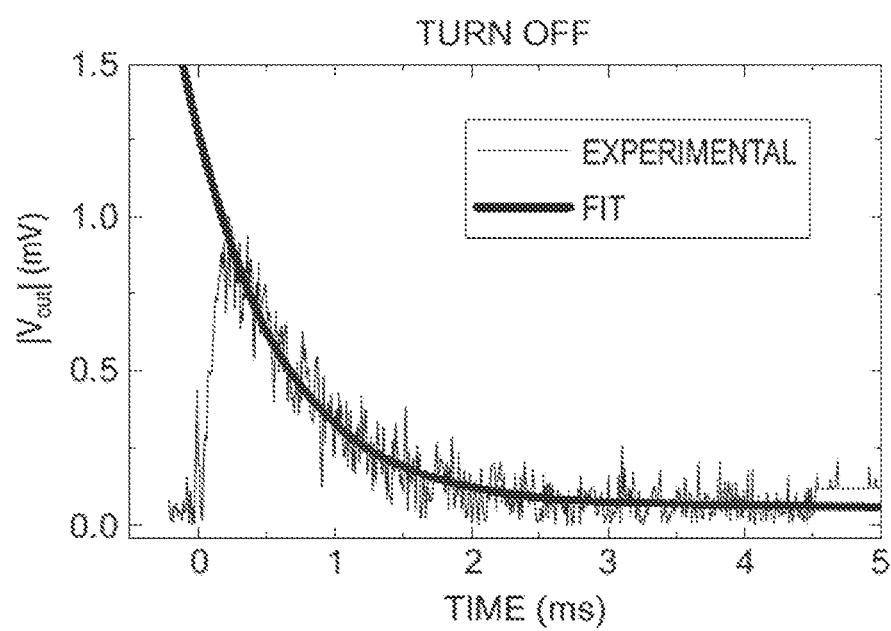
Figure 5C:
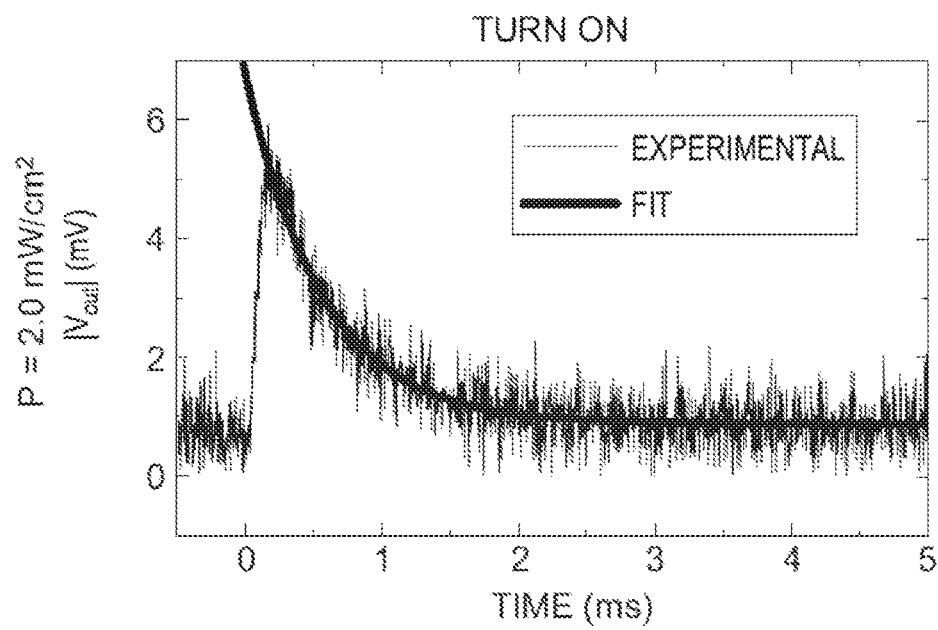
Figure 5D:
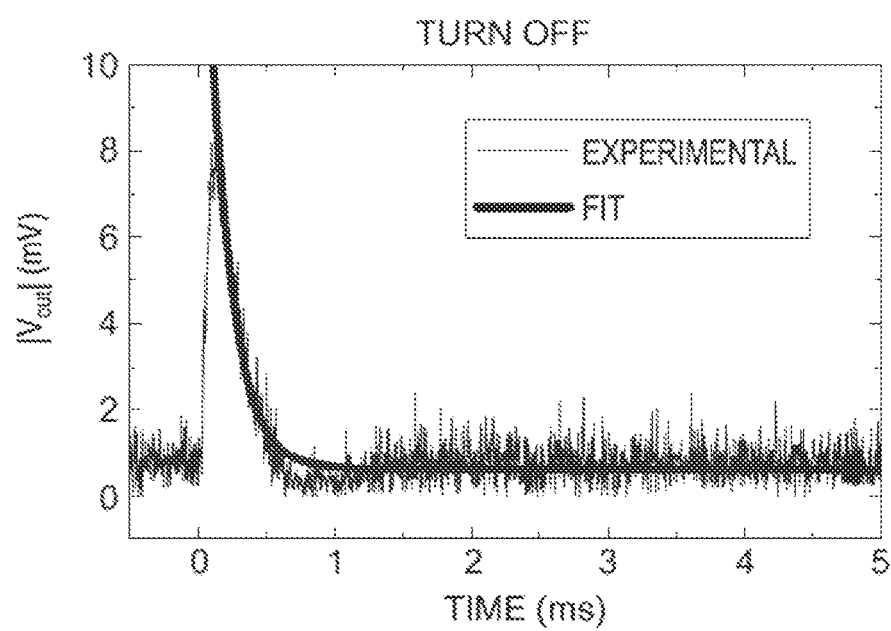
Figure 5E:
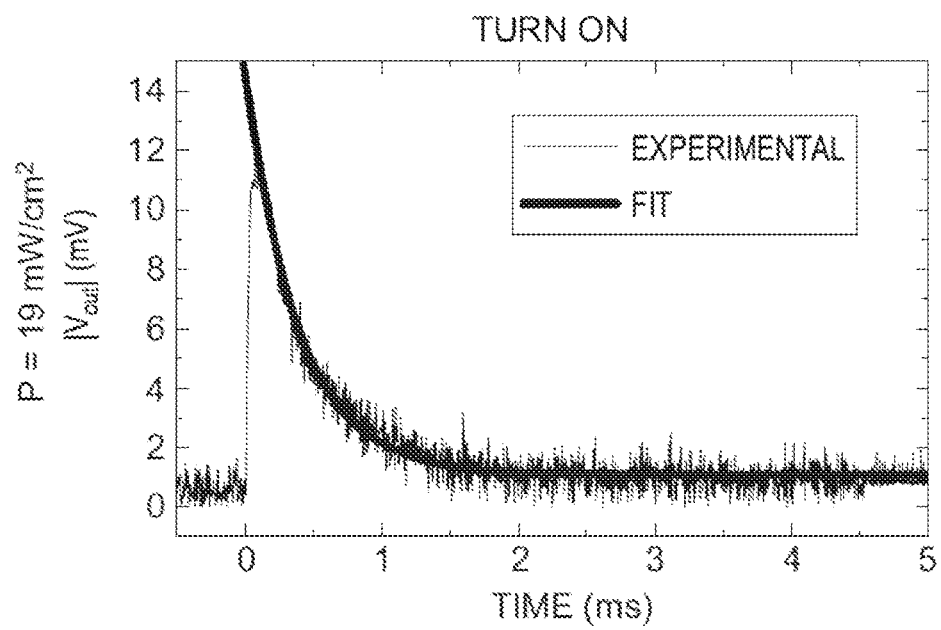
Figure 5F:
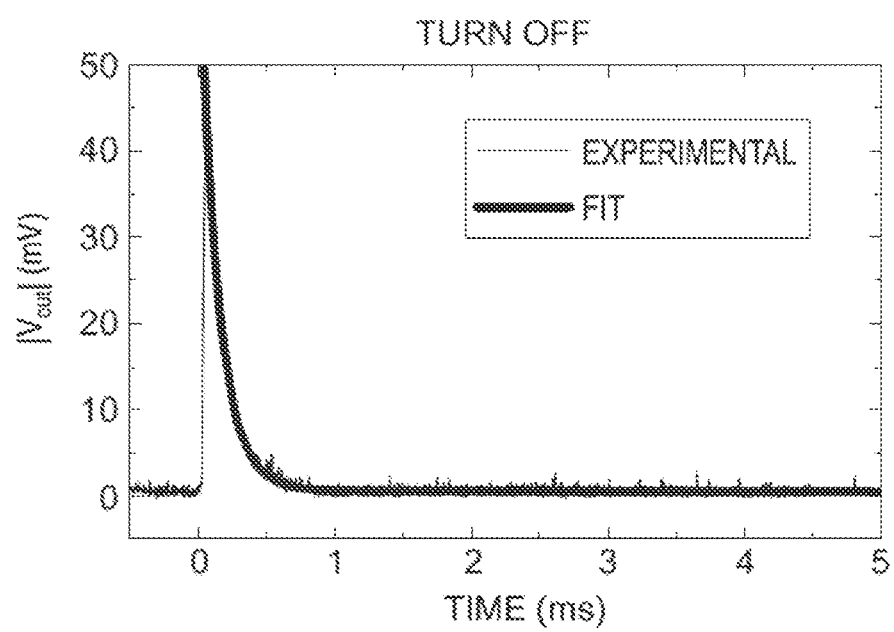
Figure 5G:
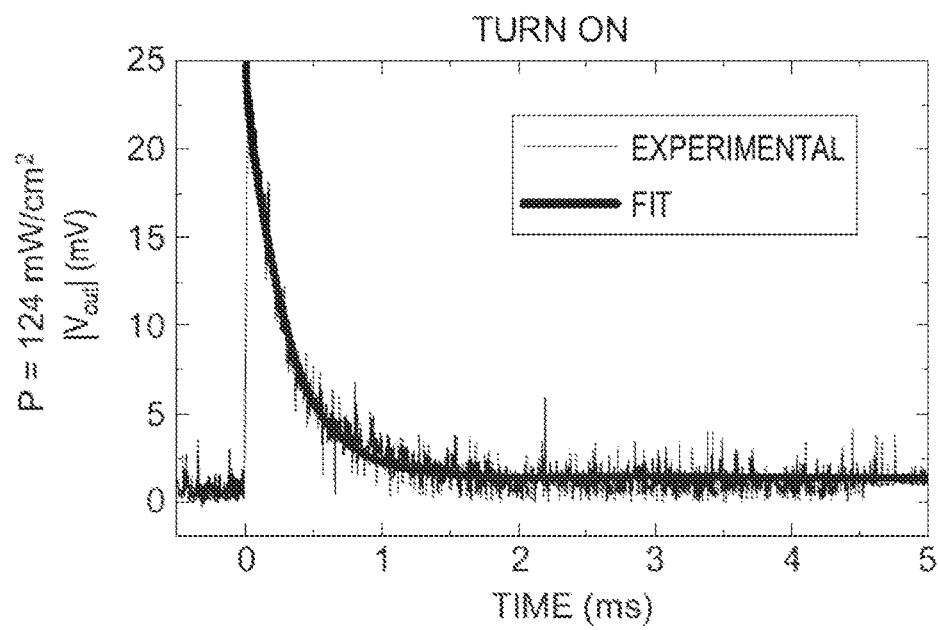
Figure 5H:
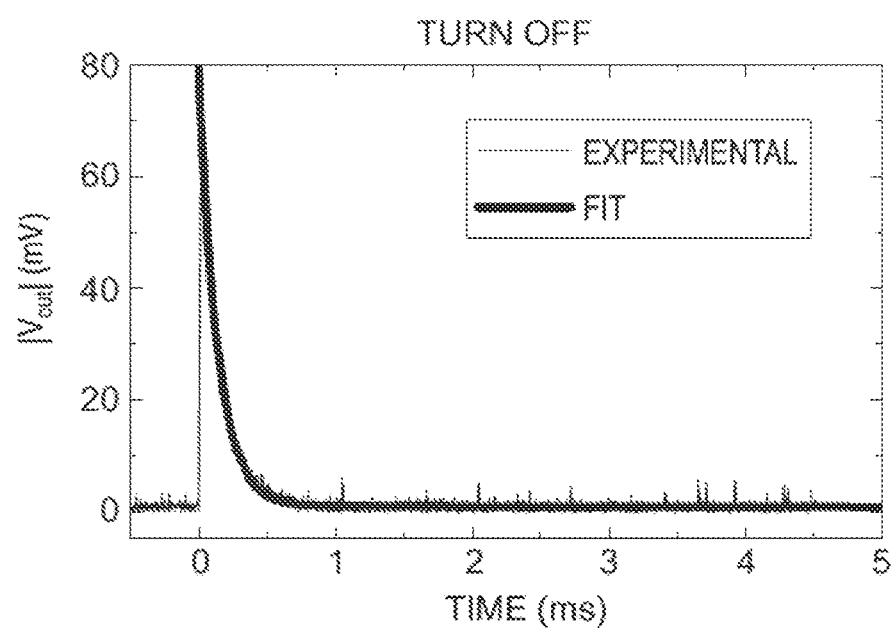

The process is hypothesized to proceed as follows. When the light is applied a roughly equal number of electrons and holes will be generated. However, since we assert that $\tau_p > \tau_n$, the system will soon equilibrate to steady-state conditions where p>n (FIG. 4C), leaving the semiconductor with a net positive charge. The net positive charge will create a driving force to pull electrons from ground to the bottom electrode or, equivalently, give the bottom electrode a lower potential relative to ground. This will be manifest as a negative $V_{out}$ on the oscilloscope. Shortly after the potential on the bottom electrode is lowered, electrons will flow from ground through the resistor, onto the bottom electrode (FIG. 4D), increasing the potential. This will continue to take place until finally the system returns to equilibrium, and $V_{out}$ returns to zero (FIG. 4E). When the light is removed, an analogous process is believed to occur: before the light is removed, the system is in steady state with the bottom electrode and ground at the same potential (FIG. 4F). We describe charges as recombining quickly relative to the RC time constant, which is a good approximation when R is large. With the net positive charge in the semiconductor now removed, the bottom electrode will have a positive potential relative to ground, and a positive $V_{out}$ will be measured (FIG. 4G). The electrons will then flow off the bottom electrode, through the resistor, to ground (FIG. 4H), before completely equilibrating as the electrode becomes electrically neutral again (FIG. 4I).

Figure 6A:
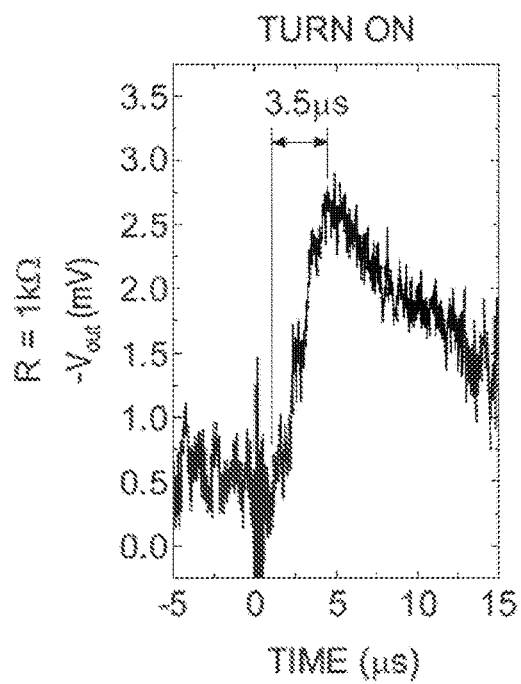
FIGS. 6A-6F illustrate a magnitude of output voltage of a prior retinomorphic sensor, $|V_{out}|$, as a function of time in response to a step function increase in light intensity from 0 to 124 mW/cm² ("TURN ON") (FIGS. 6A, 6C, 6E) and a step function reduction in light intensity from 124 to 0 mW/cm² ("TURN OFF") (FIGS. 6B, 6D, 6F), for various values of R, with the values in μs are values of rise time approximated from this data.
Figure 6B:
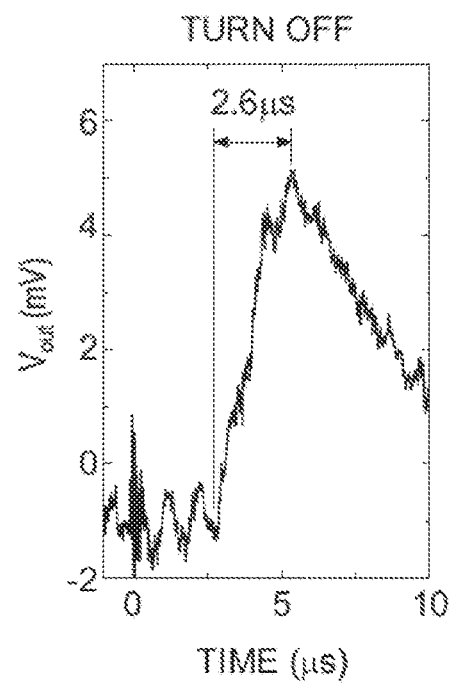
Figure 6C:
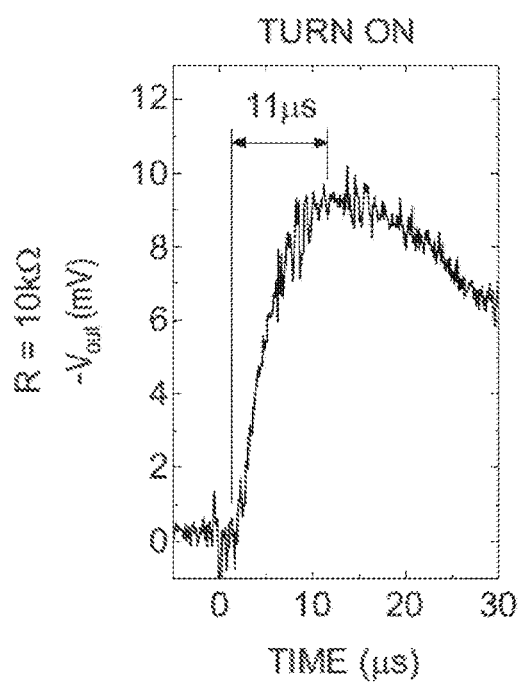
Figure 6D:
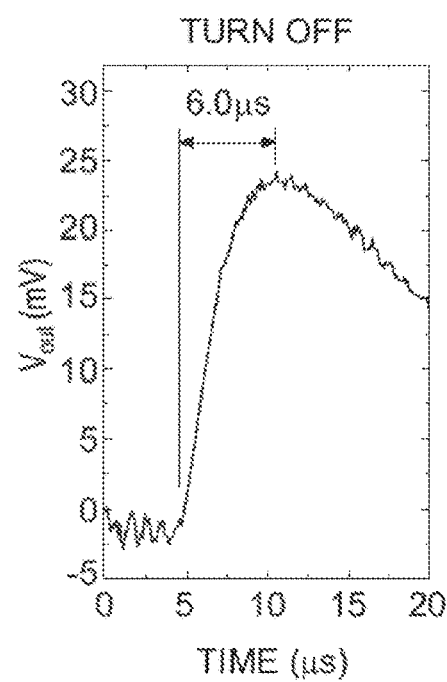
Figure 6E:
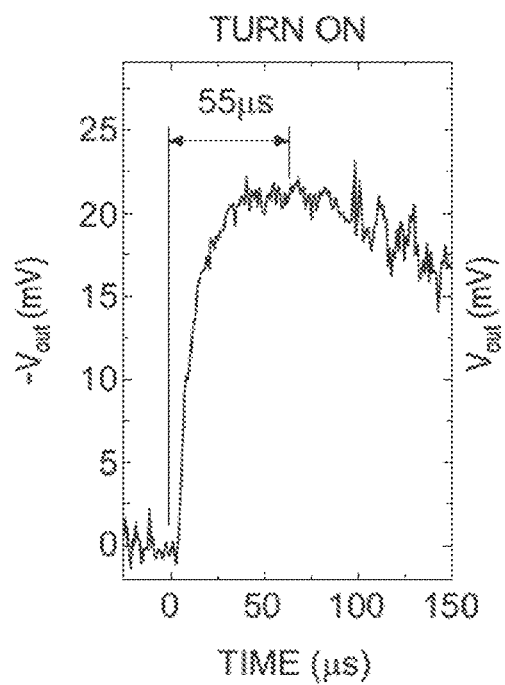
Figure 6F:
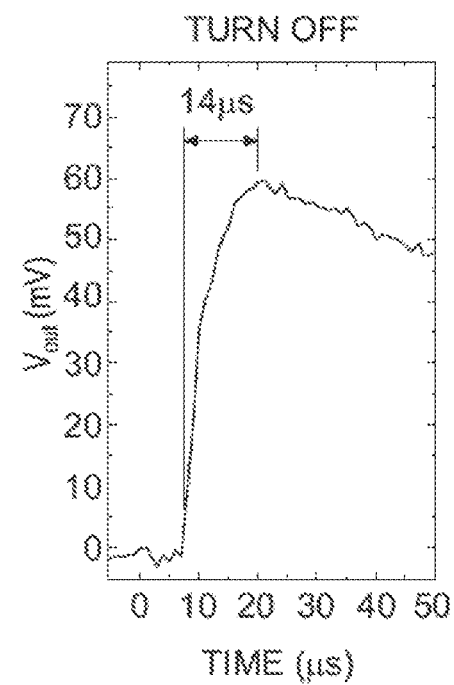
Figure 6G:
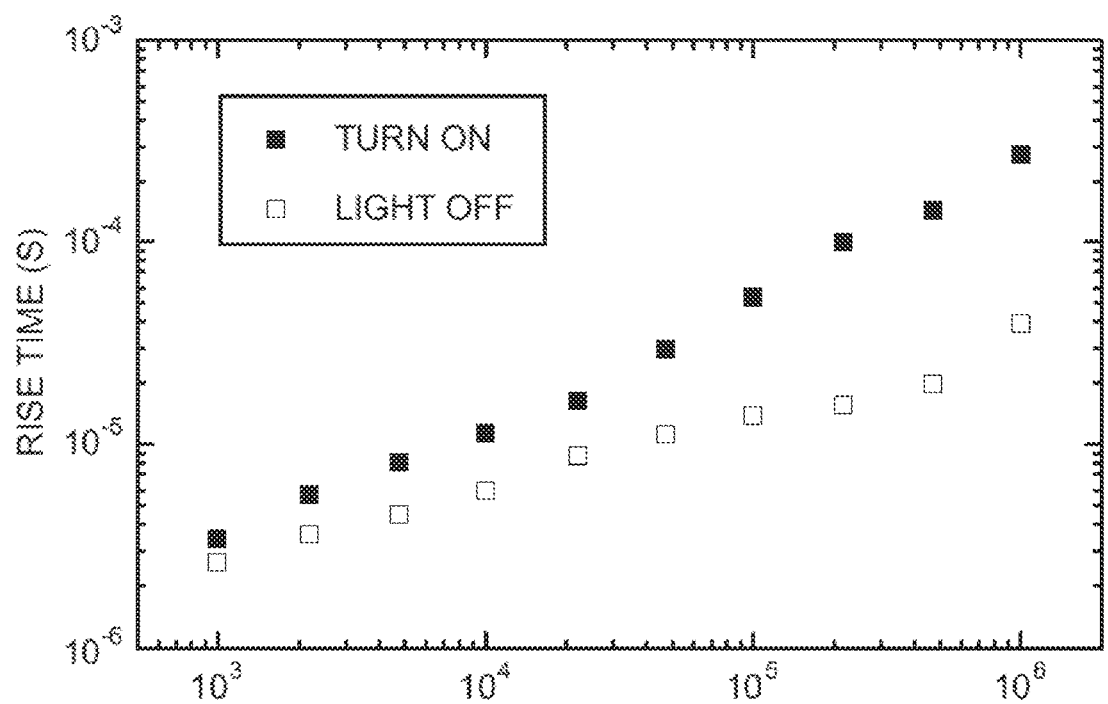
FIG. 6G shows rise time of the sensor of FIGS. 6A-6F approximated as a function of R with $V_{in}$=5V in all cases.

This description is consistent with our observation of a negative $V_{out}$ when the light was applied and a positive $V_{out}$ when the light was removed. We expect the opposite would be true if $\tau_p < \tau_n$. Our description is also consistent with the fast increase in $|V_{out}|$ when the light is applied or withdrawn, and a subsequent slower monoexponential decay in $|V_{out}|$, which depends on R. When R is low, say ≲1 kΩ, carrier recombination is anticipated to be comparable to the device decay time (τ). This would be expected to result in r being comparable to the rise time in response to the light being removed (see FIGS. 6B, 6D, 6F).

We acknowledge however that this model is likely to be oversimplified. It does not explain why the device is largely insensitive to $V_{in}$, as one would expect an applied bias to lead to a re-distribution and injection/extraction of charge across the top electrode 103. The bias may be less influential if p>n at the semiconductor/dielectric interface only, and elsewhere p≈n, however we have no direct evidence that this is the case. Similarly, the asymmetry between $|V_{out}|$ when the light is turned on and when the light is turned off is not explained in this description. It is possible that the timescales involved in reaching steady state are longer than carrier recombination. In this case, some charge would flow onto the bottom electrode 102 when the light is turned on, but before the peak charge density in the semiconductor is established, essentially broadening the $|V_{out}|$ peak when the light is applied. The longer rise times observed for the light being applied compared to when it is removed, as shown in FIGS. 5A-5F, are consistent with this description. However, further study will be required to understand this feature more conclusively.

Additional variations in the capacitor 101 are contemplated. For example, changing the constituent blend ratio, semiconductor compounds, dielectric interfaces, as well as carrying out impedance measurements, will likely all result in refinements to our model. If the mechanism proposed is broadly true, there are some interesting implications for future device optimization. For example, because these capacitors 101 rely on accumulated static charge, rather than photocurrent, the charge carrier mobility in the semiconductor system is unlikely to be a determining factor in device performance, opening the door to a wider range of absorber materials. Similarly, without the requirement of continuous percolating networks between electrodes 102, 103, one can consider micro morphologies which would be non-ideal for devices like OPV, such as finely intermixed p- and n-type materials. The requirement of one dominant carrier type may necessitate uneven blend ratios or the intentional inclusion of traps.

We have demonstrated a spiking retinomorphic capacitor 101 which employs an organic semiconductor as the absorber layer and a transparent conducting oxide as the top electrode 103. The capacitor 101 was observed to be highly stable under constant bias conditions and produced a reproducible and consistent response to a step-change in illumination. The capacitor 101 exhibited a decay time which was controllable through the choice of external resistor R, with a minimum response time <10 μs. Unexpectedly, the capacitor 101 was found to produce the desired response even without an applied input voltage. This result was rationalized by a simple model where the lifetimes of holes and electrons in the semiconductor were dissimilar. This is potentially highly desirable as it could enable an RC circuit to be fabricated as an integrated vertical two-terminal device, rather than a three-terminal device, as originally thought. This could make sensor arrays less complex to fabricate and enable higher density. Indeed, if the proposed mechanism is accurate, it may be discovered that a top electrode 103 is not required at all.

Experimental Section

Retinomorphic Sensor Fabrication: Highly doped (n++) silicon wafers with a 300 nm thermally grown silicon dioxide ($SiO_2$) dielectric layer were purchased from University Wafer. Wafers were cut into 1.0 cm×1.5 cm rectangles using a wafer saw then cleaned using acetone, isopropanol, then a UV-Ozone cleaner. Two parent solutions, 40 mg/ml poly(3-hexylthiophene-2,5-diyl) (P3HT) and 40 mg/ml phenyl-C61-butyric acid methyl ester (PCBM), both in chlorobenzene, were made and left stirring overnight at 60° C. under atmospheric-pressure $N_2$. A blended solution was made from these parent solutions with a 1:1 ratio of P3HT to PCBM (weight %). Solutions were spin-cast onto the Si++/$SiO_2$ substrates at 1500 rpm for 1 minute, and then annealed at 100° C. for 30 minutes in ambient-pressure $N_2$ to drive off solvent. 100 nm indium tin oxide (ITO) top electrodes were deposited using an AJA International Orion 5 sputtering system, through shadow masks. A 2 inch diameter indium oxide ($In_2O_3$)/tin oxide (SnO) ceramic target was used with a 90:10 (weight %) ratio of $In_2O_3$:SnO. The RF power was 75 W, the pressure was 5 mTorr, the Ar flow rate was 31.8 sccm, and the $O_2$ flow rate was 0.2 sccm. The substrate-to-source distance was approximately 10 cm. The substrate was not heated during deposition. Devices had an ITO area of roughly 0.05 cm$^2$ in all cases. P3HT was purchased from Sigma Aldrich, had average molecular weight of 85,000 to 100,000 g/mol, and regioregularity of ≥90%. PCBM was purchased from Solenne BV, and was >99.5% pure.

Retinomorphic Sensor Fabrication: The measurement setup is illustrated in FIG. 1A. The capacitor 101 was contacted in an ambient-pressure N$_2$ glovebox at room temperature using an Everbeing C-2 probe station. A positive voltage $V_{in}$ was applied to the top (ITO) terminal 103 of the photo-sensitive capacitor 101 using a Keithley 2400 sourcemeter. The Si$^{++}$ terminal 102 was connected to one terminal of a conventional resistor 111 of resistance R, the other terminal of which was connected to ground. The voltage dropped across the external resistor 111 was monitored with a Tektronix TDS 3032C digital oscilloscope. Illumination was provided with a ThorLabs SOLIS-525C High-Power Green (525 nm) LED, controlled with a ThorLabs DC2200 LED Controller. The LED controller was driven using internal modulation mode, and the external trigger link was used to trigger the oscilloscope. The oscilloscope's in-built averaging function was used when the magnitude of the output voltage was low relative to noise levels. The LED optical power density was calibrated using a Newport 2936-R Optical Power Meter and a Newport 919P-003-10 High Sensitivity Thermopile Sensor. The LED was calibrated manually for the 28 points considered in FIG. 1F, and linear interpolation between these points was used for some of the values in FIGS. 3B and 3C.

Various designs for single device structures in accordance with the present invention are depicted in FIGS. 10A-10D. Highly doped (>>10$^{17}$ cm$^{-3}$) silicon wafers with thermally grown silicon oxide (SiO$_2$) insulator layers (~200 nm-3 μm) may be used, FIG. 10A.

Up until now all experimental measurements of retinomorphic sensors have employed an external resistor. This enables facile device fabrication and testing. It also allows one to tune the decay time via choice of R. However, these designs are not desirable for real world devices. In particular, when it comes to forming sensor arrays it is not practical to have an external resistor for every pixel. To advance these sensors closer towards arrays, the challenges associated with more complex structures must be identified and addressed. Thus, in another of its aspects the present invention may provide an integrated resistor.

Figure 11A:
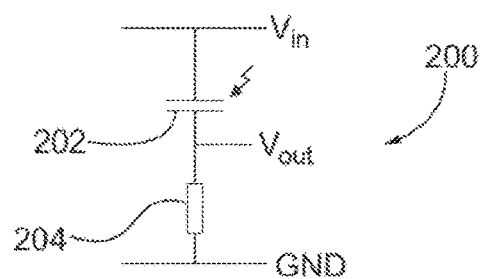
FIGS. 11A-11C schematically illustrate a circuit diagram, cross-sectional view, and top-down view, respectively, of a complete retinomorphic sensor in accordance with the present invention composed of an integrated photosensitive capacitor and resistor, where ITO is indium tin oxide, $In_2O_3$: indium oxide.
Figure 11B:
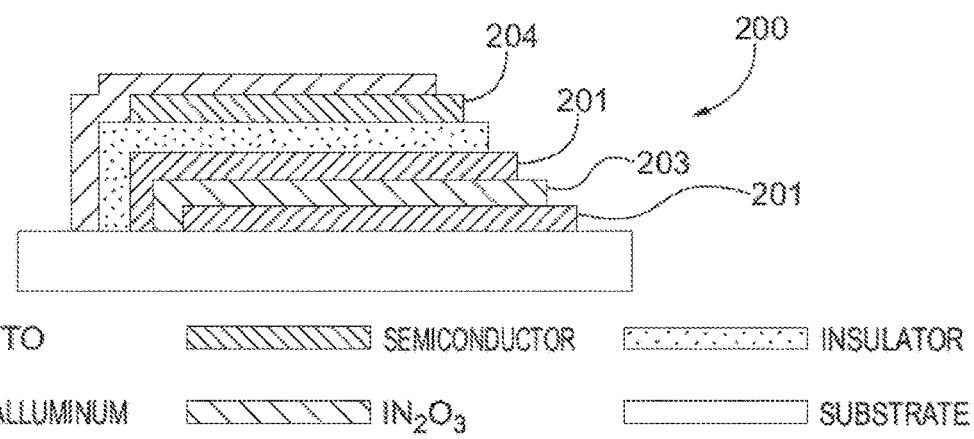
Figure 11C:
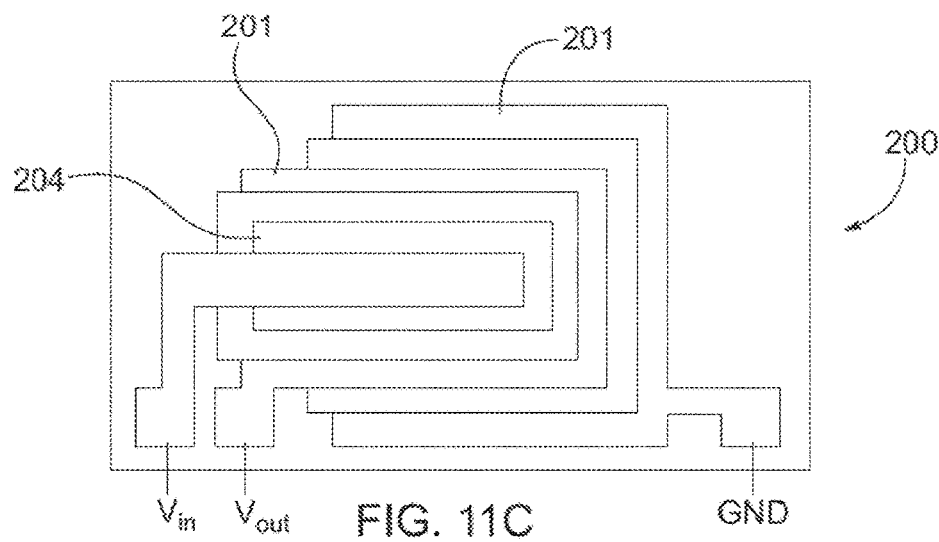

FIGS. 11A-11C show one exemplary design 200 in accordance with the present invention which integrates vertical capacitor-resistor structures. In this structure, the photo-sensitive capacitor 202 is at the top of the structure, and the resistor 204 at the bottom. The resistor 204 is formed of a thin layer 203 of the wide bandgap metal oxide semiconductor indium oxide (In$_2$O$_3$) sandwiched between two aluminum electrodes 201. In$_2$O$_3$ is a good candidate material because it is known to form highly-uniform and stackable thin films. By changing the thickness of the In$_2$O$_3$ layer, one can exert delicate control over the value R, and hence the decay time, of the retinomorphic sensor.

Because the response time of these sensors is determined by the RC-constant, and not a sampling frequency (c.f. conventional sensors), certain embodiments of the present invention can distinguish signals at short time scales by changing the thickness of the In$_2$O$_3$ layer 204 in FIGS. 11A-11C.

Figure 12A:
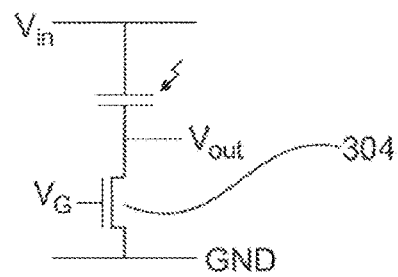
FIGS. 12A-12C schematically illustrate a circuit diagram, cross-sectional view, and top-down view, respectively, of a tunable decay-time retinomorphic sensor in accordance with the present invention composed of a photosensitive capacitor and integrated transistor.
Figure 12B:
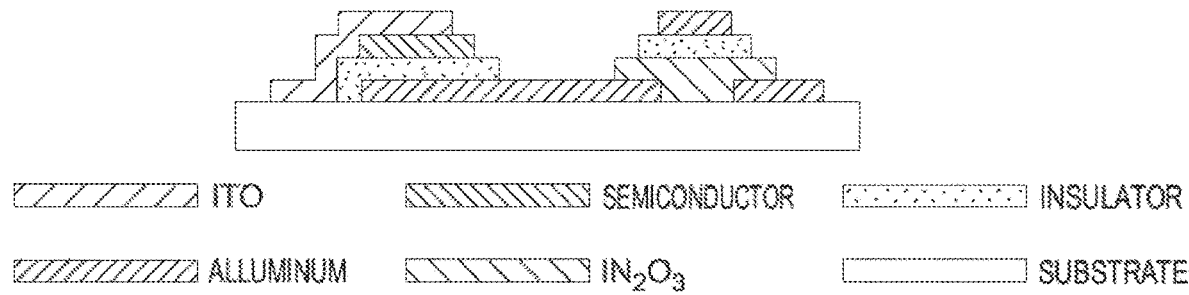
Figure 12C:
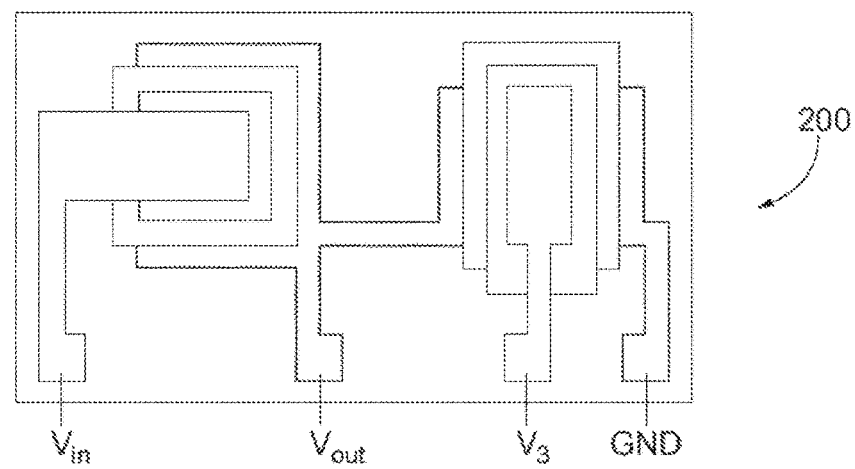
Figure 13A:
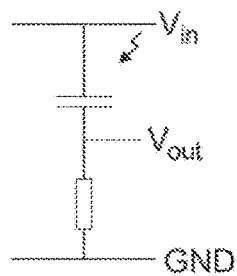
FIGS. 13A-13E schematically illustrate an exemplary array of retinomorphic sensors in accordance with the present invention, with FIG. 13A showing a circuit diagram of an individual pixel, FIG. 13B showing a cross-sectional view of an individual pixel, FIG. 13C showing a top-down view of an individual pixel, FIG. 13D showing a circuit diagram of a 4×4 array, and FIG. 13E showing a top-down image of the 4×4 array.
Figure 13B:
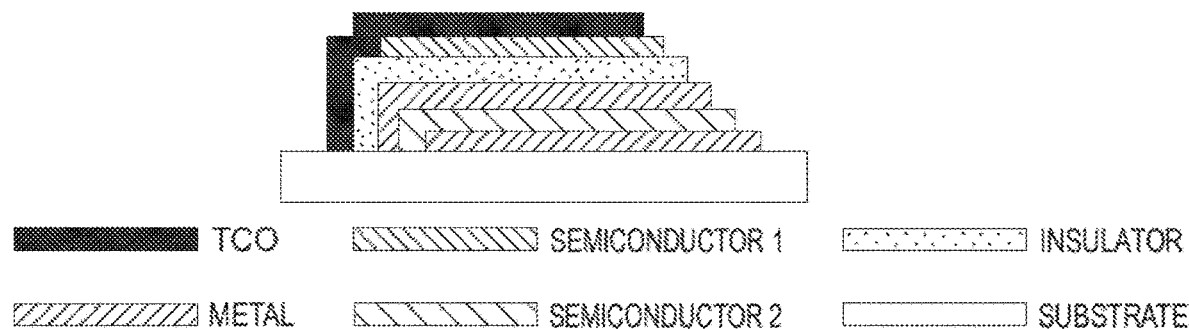
Figure 13C:
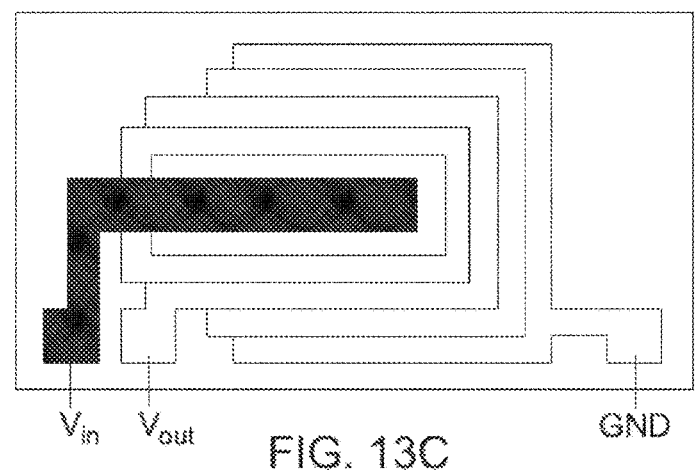
Figure 13D:
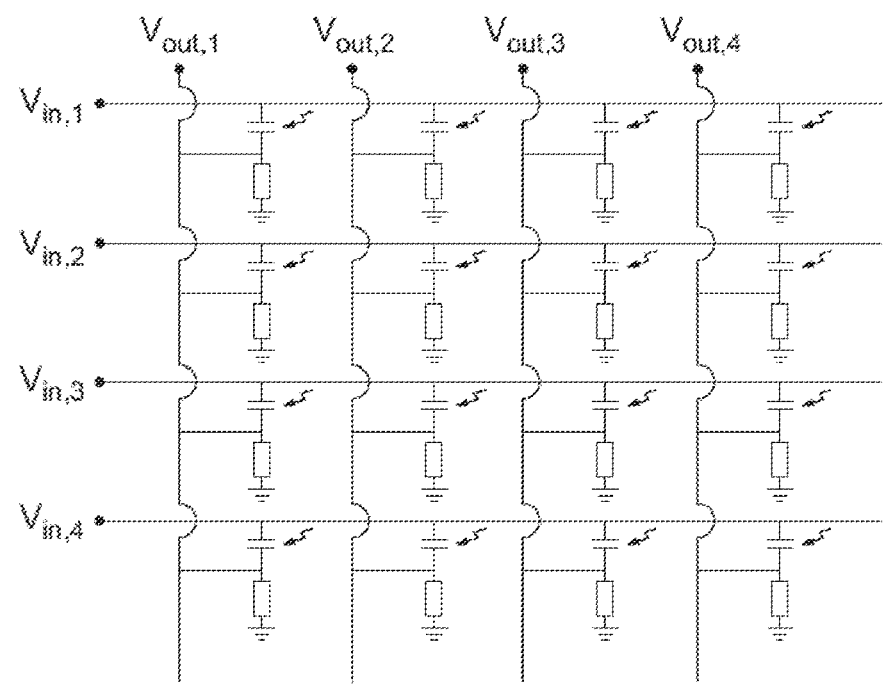
Figure 13E:
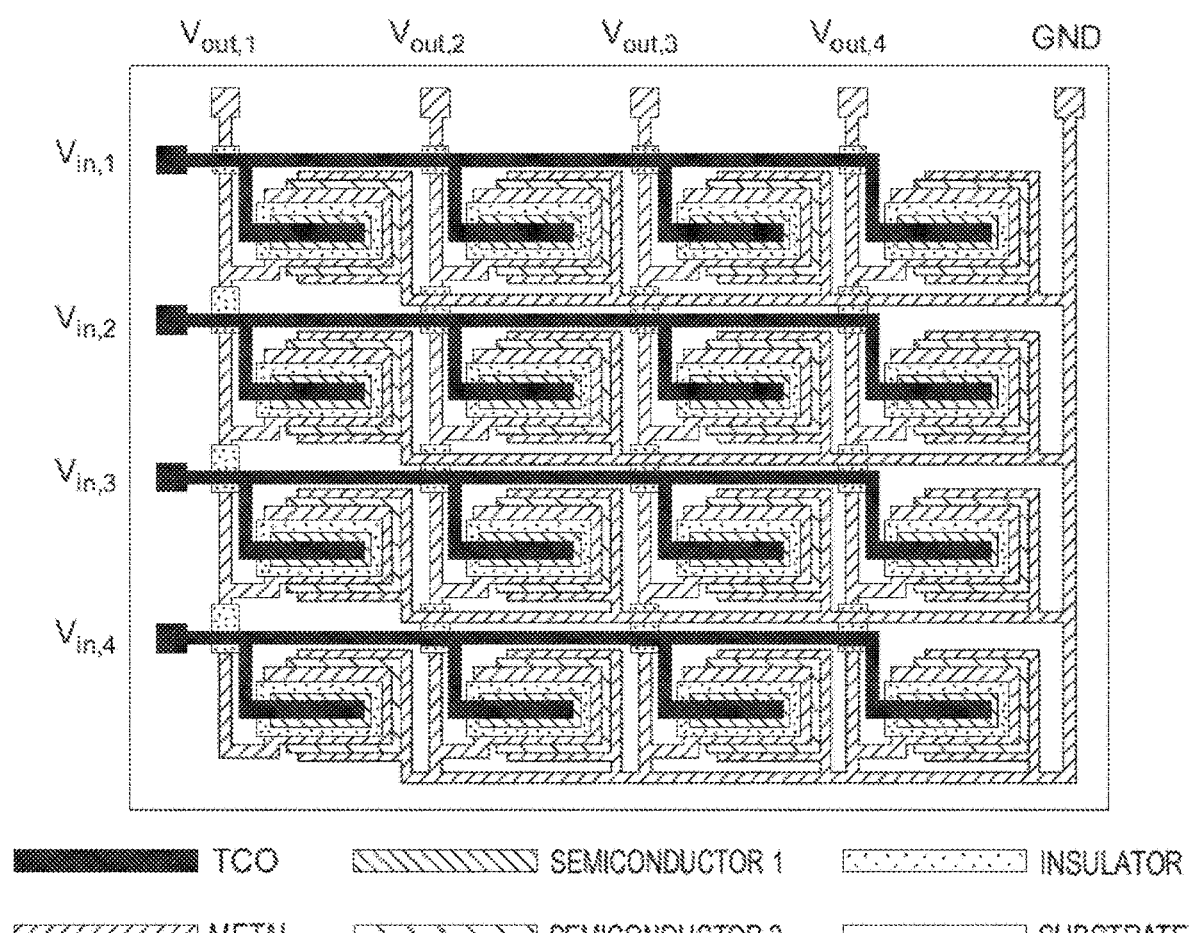
Figure 14A:
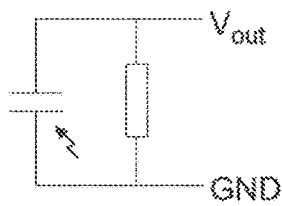
FIGS. 14A-14E schematically illustrate another exemplary array of retinomorphic sensors in accordance with the present invention, with FIG. 14A showing a circuit diagram of an individual pixel, FIG. 14B showing a cross-sectional view of an individual pixel, FIG. 14C showing a top-down view of an individual pixel, FIG. 14D showing a circuit diagram of a 4×4 array, and FIG. 14E showing a top-down image of the 4×4 array.
Figure 14B:
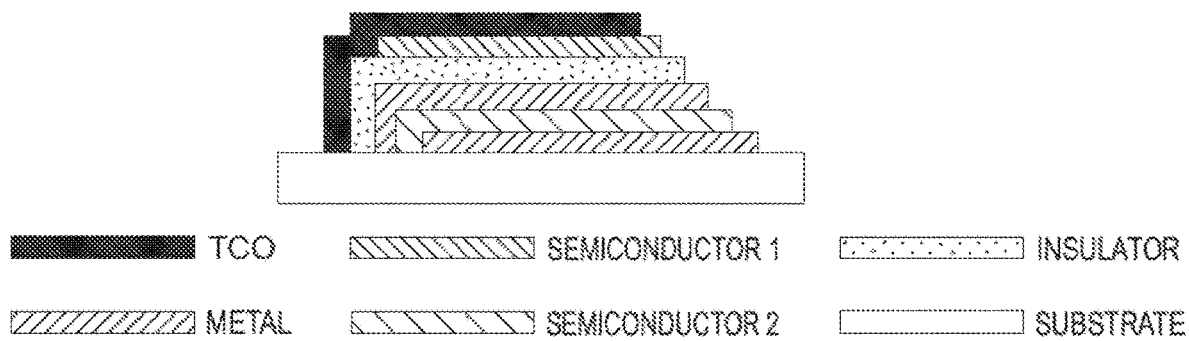
Figure 14C:
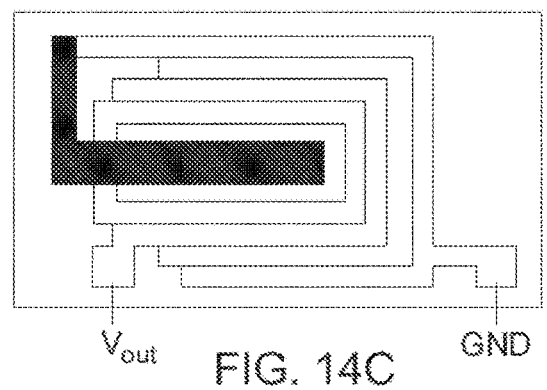
Figure 14D:
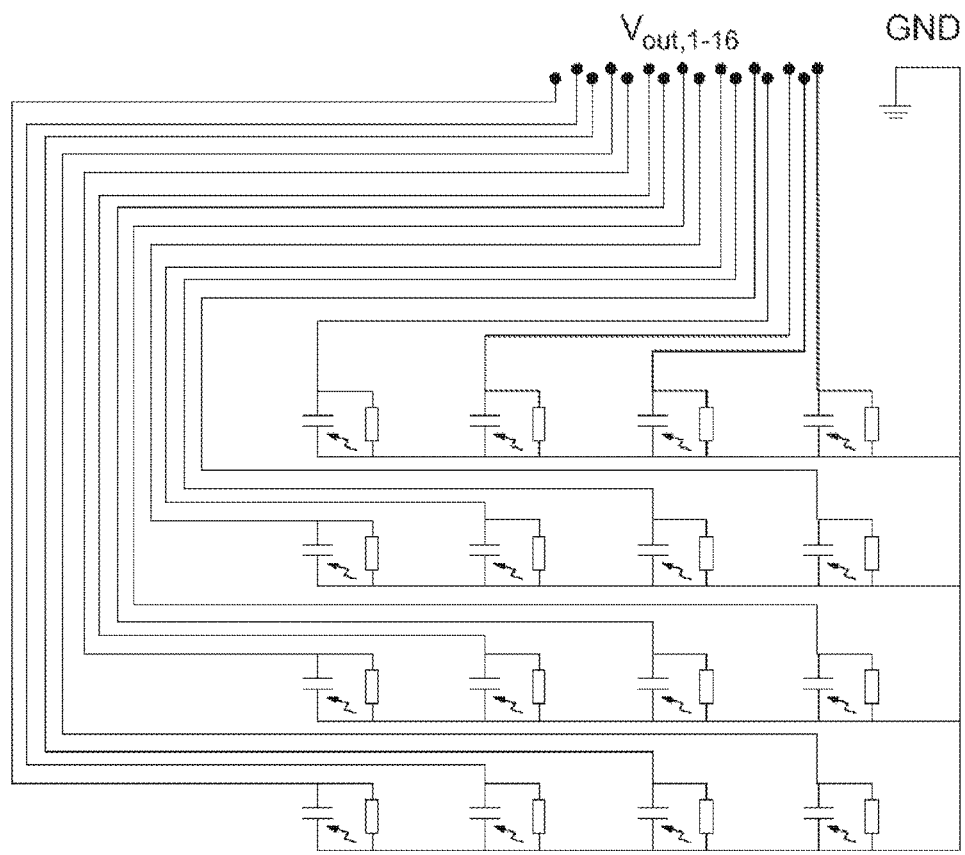
Figure 14E:
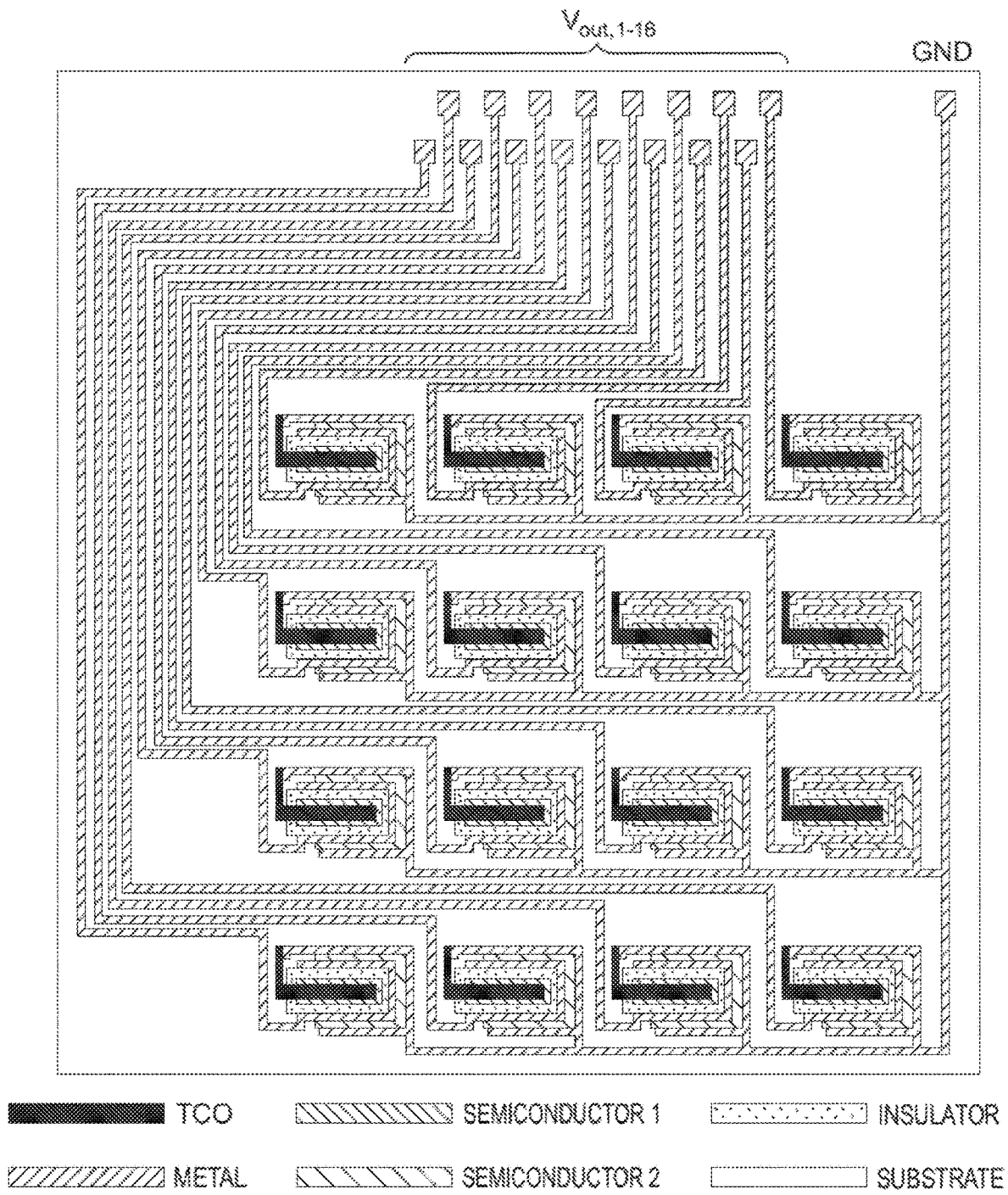
Figure 15A:
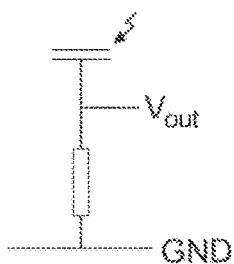
FIGS. 15A-15E schematically illustrate yet a further exemplary array of retinomorphic sensors in accordance with the present invention, with FIG. 15A showing a circuit diagram of an individual pixel, FIG. 15B showing a cross-sectional view of an individual pixel, FIG. 15C showing a top-down view of an individual pixel, FIG. 15D showing a circuit diagram of a 4×4 array, and FIG. 15E showing a top-down image of the 4×4 array.
Figure 15B:
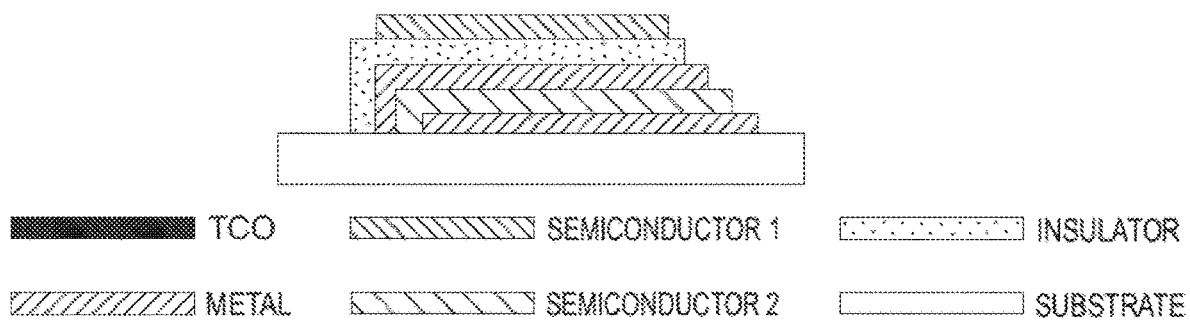
Figure 15C:
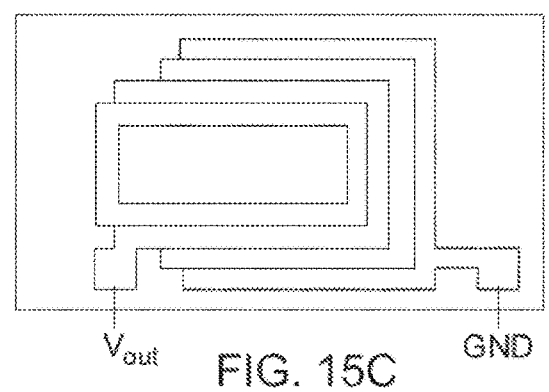
Figure 15D:
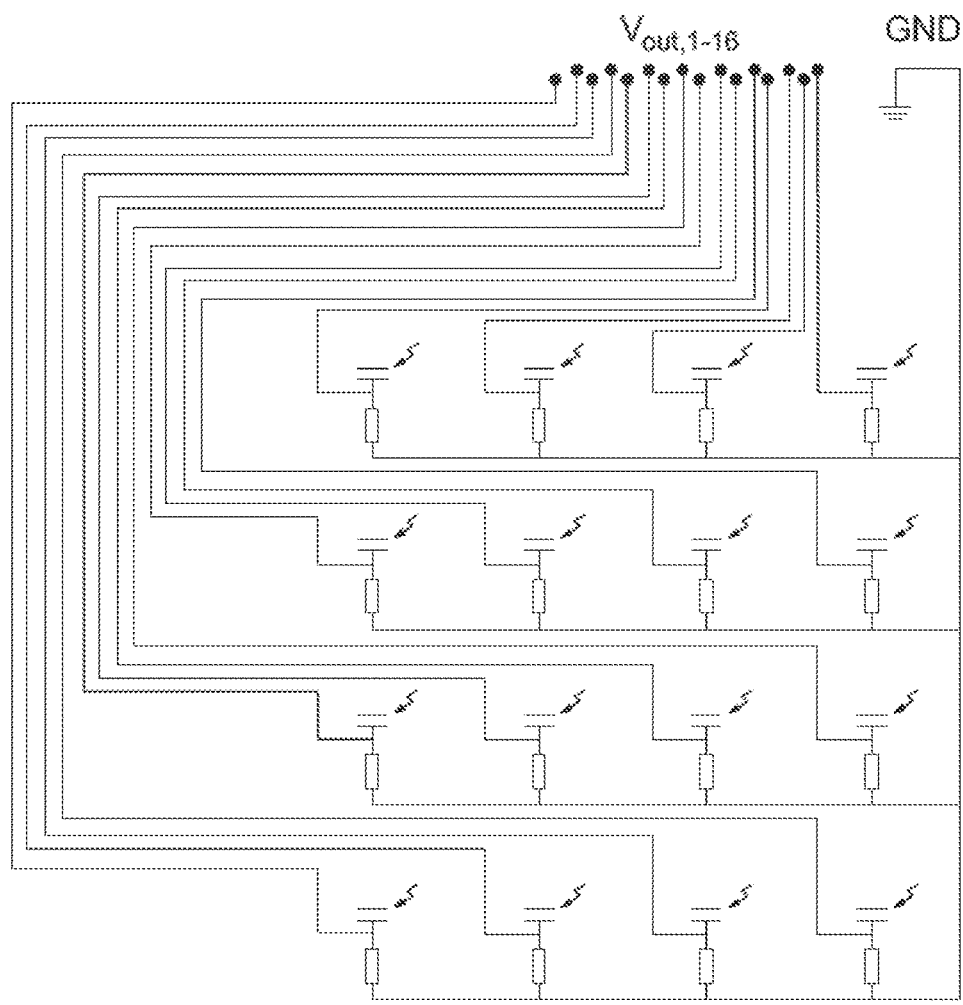
Figure 15E:
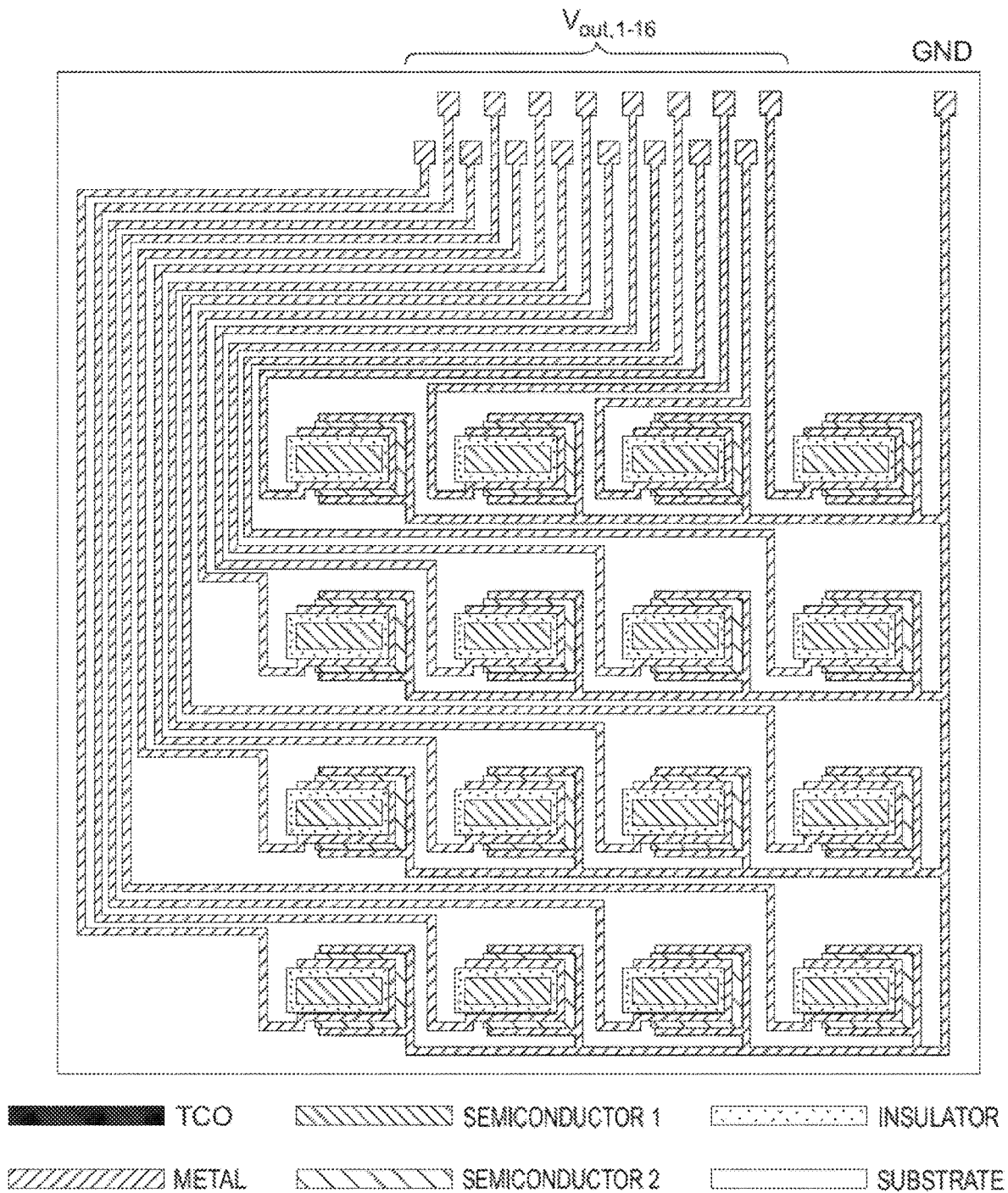

FIGS. 11A-11C illustrate one exemplary configuration of an integrated vertical structure with a resistor 204 below a capacitor 202. A downside to this structure however is that the integrated resistor 204 would be fixed. This means that once fabricated, the decay constant (τ) cannot be adjusted. An alternative approach is to instead use a thin film transistor (TFT) 304 in place of the resistor 204, as depicted in FIGS. 12A-12C. The conductivity of a TFT channel can be modulated by application of a gate voltage ($V_G$). This means the TFT can be considered a variable resistor, where the user defines the resistivity. For our retinomorphic sensors, this results in one having control of τ through a choice of $V_G$.

In$_2$O$_3$ TFTs are known to possess large on/off ratios which will enable their conductivity to be modulated over several orders of magnitude by $V_G$. This will in-turn enable τ to be modulated by several orders of magnitude also. The complete structures depicted in FIGS. 12A-12C can be fabricated using a combination of thermal evaporation and sputtering through shadow masks.

Other Material Options

As noted, the upper contact 103 should be at least 50% transparent to visible light at 50 nm thickness and have sufficiently low contact resistance with the semiconductor absorber layer 106 so as to not constrain the ability of the resistor to tune the response time, FIG. 1. Indium tin oxide (ITO) is used in some exemplary embodiments.

The semiconductor layer 106 used as the absorber does not need a high carrier mobility, nor an idealized microstructure, to exhibit good performance. This is because charges only need to be present, not extracted, to contribute to current. For this reason, we can consider semiconductor systems which are frequently overlooked because of their low long range mobility, such as p-type metal oxides. In order to enable facile process integration, we here restrict our attention to semiconductors that can be deposited via RF sputtering and are stable ≥400° C. These compounds must be semiconducting and have an optical band gap in the visible region of the electromagnetic spectrum (roughly 0.5 eV to 2.5 eV). Some examples include SnO/SnO$_2$, CuO/CuO$_2$, NiO, CeZnSbO, Cu$_3$VO$_4$, and CuBi$_2$O$_4$.

Example Applications

Manufacturing of modern semiconductor devices is made possible with complex tools that contain many subsystems. While efficient operation of several such subsystems—such as gas flow subsystem, high temperature parts, RF subsystem and others—may not be perceived safely by human senses alone and rely on other sensor data feeds, there is still a tendency for process and hardware engineers to visually inspect operation of plasma (CW or pulsed) states during process development and observe robotic motion (spindle, wafer handlers, etc.) to determine safe wafer movement or other motions associated with safe tool operation. Traditional camera-based sensors (such as CMOS and CCD) have been used to determine plasma operation and wafer movement but have faced some limitations. In the case of plasma operation, the sensors tend to saturate in the plasma region requiring extensive tuning of operating configuration of camera and design add-on optical elements to the camera that can be expensive, and these are strongly dependent on process recipes, i.e., mode of operation of the tool, which evolve with applications and may differ for different customers. With respect to monitoring part and wafer movement the challenge generally lies in lighting conditions and shadowing in the process chamber. From a computer vision and machine learning perspective, both scenarios can lead to sub-optimal model development which may not address every scenario in a high-volume manufacturing environment.

Devices of the present invention offer the interesting possibility of use in very high optical irradiance settings, such as inside plasma reactors, where conventional sensors will typically saturate. As a differentiator, the output signal of this retinomorphic sensor is zero when illumination is constant, and some non-zero value for changes in intensity. Therefore, changes in intensity under very high P should be easy to detect using a retinomorphic sensor of the present invention and an amplifier.

Since, in contrast to conventional image sensors a retinomorphic sensor relies on changes in illumination, retinomorphic sensors can provide better opportunities to develop computer vision and machine learning applications.

In addition, devices based on the current invention enable the identification of moving objects at much faster speeds than current optical-sensing strategies. For this reason, the devices have potential utility in environments where rapid identification of moving objects is crucial, such as autonomous vehicles and projectile tracking.

Arrays of Retinomorphic Thin-Film Sensing Elements

For example, four exemplary designs of retinomorphic sensor arrays are shown in FIGS. 13A-16E. The individual sensors of the array operate on the principles described above, and have the previously separate capacitor and resistor elements integrated into vertical structures.

Terminology/Notation

In FIGS. 13A-15E the following terms are used:

Si++: highly doped silicon, which acts as a metal;

$SiO_2$: silicon dioxide oxide, which acts as a resistor/electrical insulator;

TCO: transparent conducting oxide, which acts as a metal but is optically transparent, e.g., indium-doped tin oxide;

Semiconductor 1: a semiconductor which absorbs visible light, e.g., intrinsic silicon, organic semiconductor blends, copper oxide;

Insulator: an electrical insulator, e.g., aluminum oxide;

Semiconductor 2: e semiconductor which does not absorb visible light, e.g., indium oxide, zinc oxide, indium-gallium-zinc oxide; Substrate: electrical insulator, e.g., glass;

$V_{in}$: input voltage;

$V_{out}$: output voltage;

GND: Ground;

Photocapacitor: The circuit symbol to the below denotes a capacitor which changes capacitance under illumination: .

In all configurations of FIGS. 13A-16E illustrate an exemplary 4×4 array, but it is understood that such array can be extended to a n×m array.

Figure 16A:
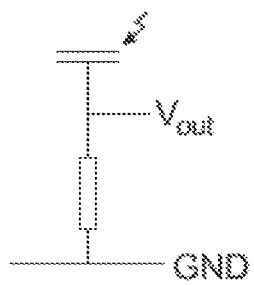
FIGS. 16A-16E schematically illustrate still a further exemplary array of retinomorphic sensors in accordance with the present invention, with FIG. 16A showing a circuit diagram of an individual pixel, FIG. 16B showing a cross-sectional view of an individual pixel, FIG. 16C showing a top-down view of an individual pixel, FIG. 16D showing a circuit diagram of a 4×4 array, and FIG. 16E showing a top-down image of a 4×4 array.
Figure 16B:
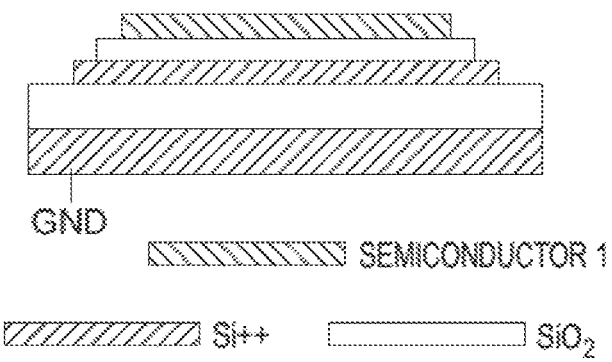
Figure 16C:
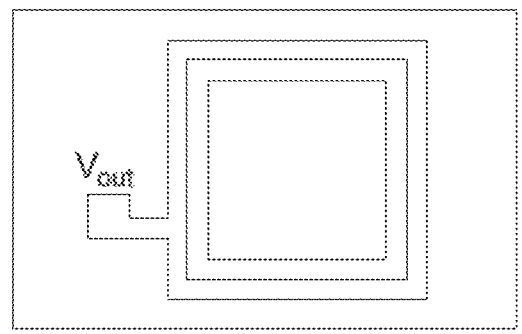
Figure 16D:
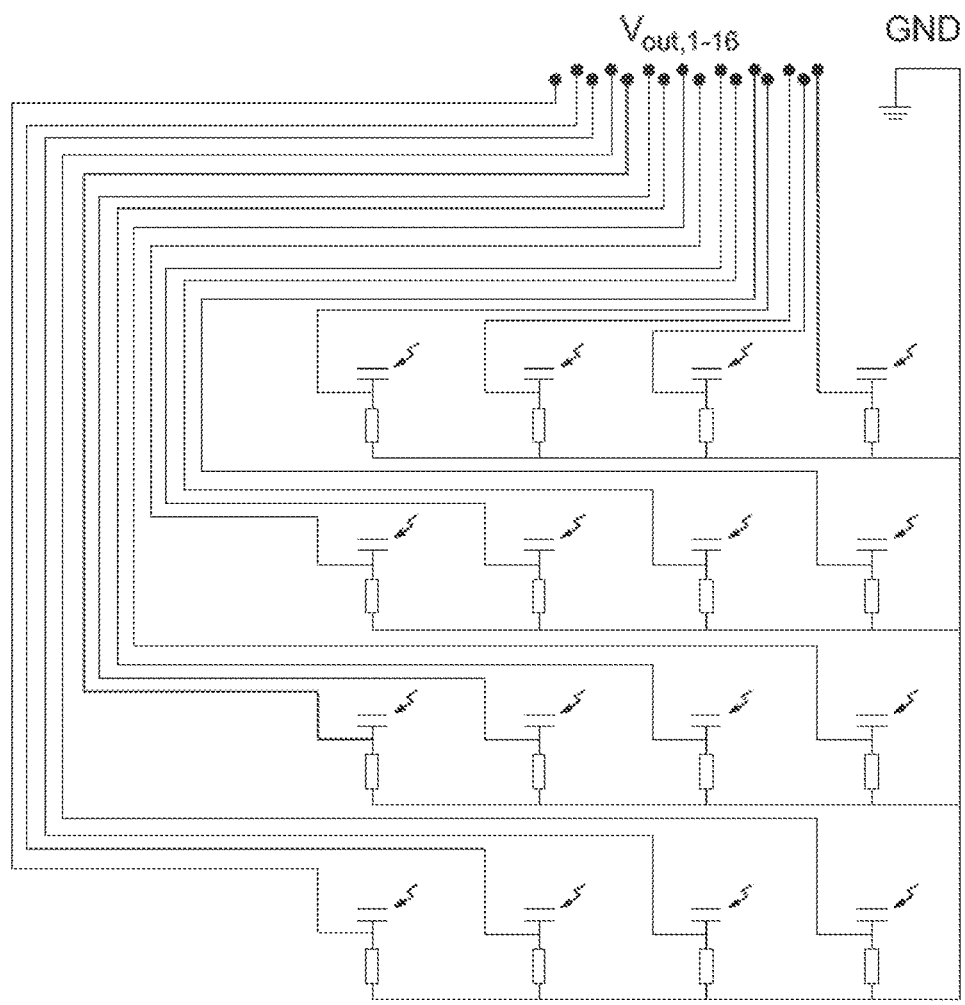
Figure 16E:
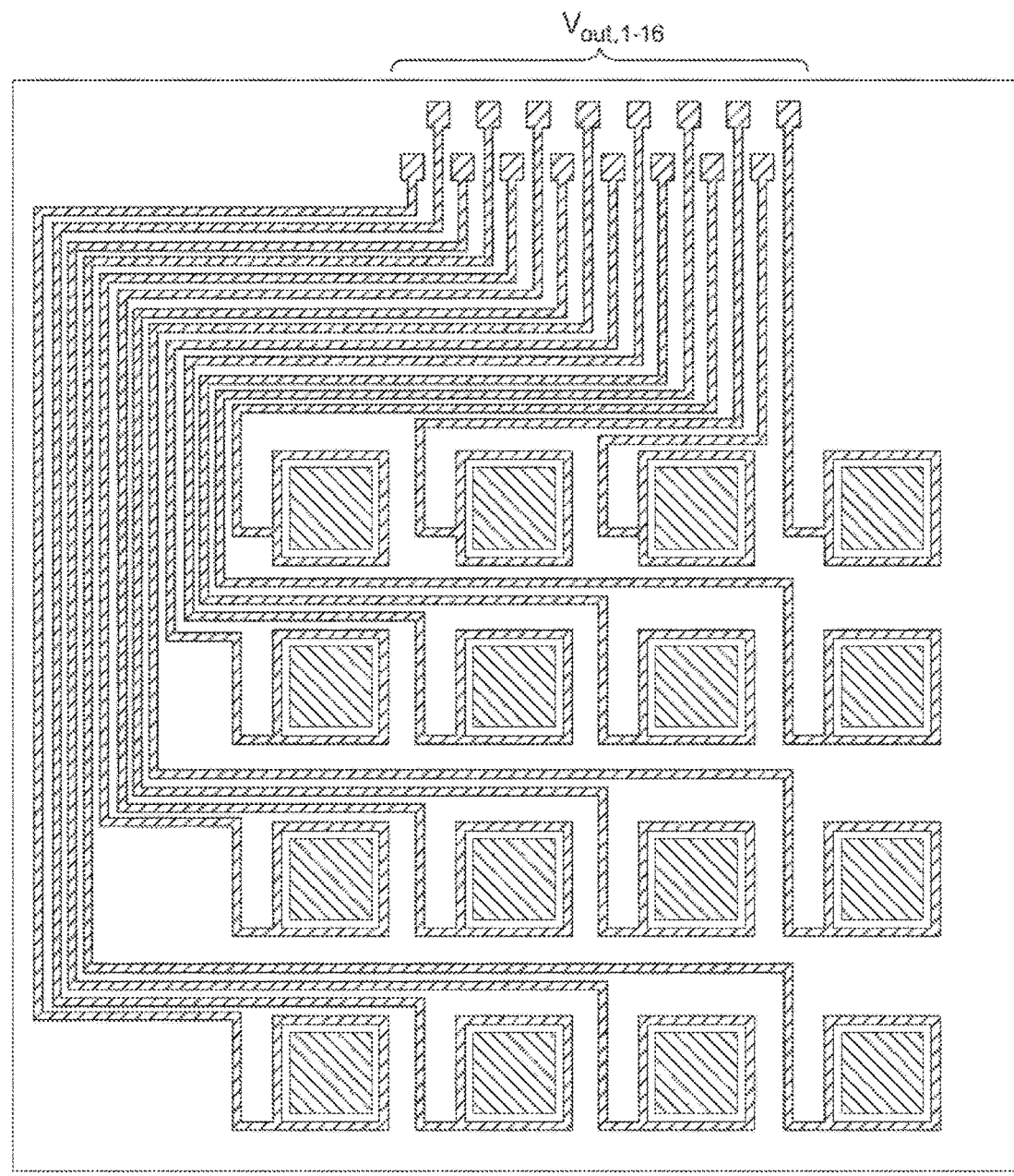

In FIGS. 16B, 16C a silicon-on-insulator (SOI) substrate is used. The bottom three layers may be highly doped silicon ($>=10^{17}$ atoms/cm$^3$) on silicon dioxide on highly doped silicon. The next layer above the bottom layer is labeled as $SiO_2$, however it could be a general insulator (as indicated by dots in FIG. 15E for example), and semiconductor 1 is the same material as referred to elsewhere (e.g. as in FIG. 15E).

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A retinomorphic sensor, comprising an upper electrode and a lower electrode, and an organic semiconductor layer disposed between the upper and lower electrodes and in electrical communication with the upper electrode, and a dielectric layer disposed between the upper and lower electrodes and in electrical communication with the lower electrode.

2. The retinomorphic sensor of claim 1, wherein the organic semiconductor layer includes poly (3-hexylthiophene-2,5-diyl).

3. The retinomorphic sensor of claim 1, wherein the organic semiconductor layer includes phenyl-$C_{61}$-butyric acid methyl.

4. The retinomorphic sensor of claim 1, wherein the organic semiconductor layer includes a 50:50 (weight %) blend of phenyl-$C_{61}$-butyric acid methyl and poly (3-hexylthiophene-2,5-diyl).

5. The retinomorphic sensor of claim 1, wherein the upper electrode includes a transparent conducting oxide.

6. The retinomorphic sensor of claim 1, wherein the upper electrode includes indium tin oxide.

7. The retinomorphic sensor of claim 1, wherein the lower electrode includes doped silicon.

8. The retinomorphic sensor of claim 1, wherein the organic semiconductor layer is absorptive to visible light.

9. The retinomorphic sensor of claim 1, comprising a resistor disposed in series with the retinomorphic sensor, the retinomorphic sensor having a decay time which is tunable in response to the value of the resistor.

10. The retinomorphic sensor of claim 9, wherein the decay time of the retinomorphic sensor decreases with a decrease in the value of the resistor.

11. The retinomorphic sensor of claim 1, wherein a response time of the retinomorphic sensor is 10 μs or less.

12. The retinomorphic sensor of claim 1, wherein the retinomorphic sensor is configured to produce a response to a change in light level on the retinomorphic sensor without an input voltage applied to the retinomorphic sensor.

13. The retinomorphic sensor of claim 1, wherein the retinomorphic sensor comprises an integrated vertical structure in which a resistor is disposed in a stack between a capacitor and a substrate and in electrical communication with the capacitor and substrate.

14. The retinomorphic sensor of claim 1, wherein the retinomorphic sensor comprises an integrated vertical structure in which a transistor is disposed in a stack between a capacitor and a substrate and in electrical communication with the capacitor and substrate.

15. An apparatus comprising an array of retinomorphic sensors of claim 1.

* * * * *